(12) United States Patent
Hamaguchi et al.

(10) Patent No.: US 9,980,392 B2
(45) Date of Patent: *May 22, 2018

(54) PROCESS FOR PRODUCING SUBSTRATE HAVING WIRING, RADIATION-SENSITIVE COMPOSITION, ELECTRONIC CIRCUIT AND ELECTRONIC DEVICE

(71) Applicant: JSR CORPORATION, Tokyo (JP)

(72) Inventors: Hitoshi Hamaguchi, Tokyo (JP); Kenrou Tanaka, Tokyo (JP); Kenzou Ookita, Tokyo (JP); Keisuke Kuriyama, Tokyo (JP)

(73) Assignee: JSR CORPORATION, Tokyo (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 15/262,404

(22) Filed: Sep. 12, 2016

(65) Prior Publication Data

US 2017/0042038 A1 Feb. 9, 2017

Related U.S. Application Data

(63) Continuation-in-part of application No. PCT/JP2015/056652, filed on Mar. 6, 2015.

(30) Foreign Application Priority Data

Mar. 14, 2014 (JP) .................. 2014-052235

(51) Int. Cl.
*G03F 7/039* (2006.01)
*G03F 7/36* (2006.01)
(Continued)

(52) U.S. Cl.
CPC .......... *H05K 3/107* (2013.01); *G03F 7/0046* (2013.01); *G03F 7/027* (2013.01); *G03F 7/0392* (2013.01);
(Continued)

(58) Field of Classification Search
None
See application file for complete search history.

(56) References Cited

U.S. PATENT DOCUMENTS 5,489,489 A * 2/1996 Swirbel .................. C23C 14/086
428/209
2003/0068581 A1 4/2003 Kawamura et al.
(Continued)

FOREIGN PATENT DOCUMENTS

JP 53-068577 * 6/1978
JP 04-269757 * 9/1992
(Continued)

OTHER PUBLICATIONS

Perreault et al. IBM Tech. Discl. vol. 34(4B) pp. 308-309 (1991).*
(Continued)

*Primary Examiner* — Martin J Angebranndt
(74) *Attorney, Agent, or Firm* — Oblon, McClelland, Maier & Neustadt, L.L.P.

(57) ABSTRACT

A process for producing a substrate having wiring includes steps (i) to (v) described as follows: (i) applying a radiation-sensitive composition on a substrate to form a coating film; (ii) irradiating a prescribed part of the coating film with radiation to allow the coating film to have a radiation-irradiated region and a radiation-unirradiated region; (iii) allowing the coating film obtained in the step (ii) to have a concave region and a convex region; (iv) forming wiring on the concave region; and (v) removing the convex region by an application of radiation or by heating.

10 Claims, 4 Drawing Sheets

(51) Int. Cl.
*G03F 7/40* (2006.01)
*H03K 3/10* (2006.01)
*H05K 3/12* (2006.01)
*H05K 3/10* (2006.01)
*G03F 7/004* (2006.01)
*G03F 7/027* (2006.01)
*G03F 7/20* (2006.01)

(52) U.S. Cl.
CPC .................. *G03F 7/36* (2013.01); *G03F 7/40* (2013.01); *G03F 7/70* (2013.01); *H05K 3/105* (2013.01); *H05K 3/1258* (2013.01)

(56) References Cited

U.S. PATENT DOCUMENTS

| | | | | |
|---|---|---|---|---|
| 2004/0103808 | A1* | 6/2004 | Lochun | B41M 1/02 101/483 |
| 2005/0112810 | A1 | 5/2005 | Kobayashi | |
| 2007/0272653 | A1* | 11/2007 | Wakita | B82Y 10/00 216/13 |
| 2008/0268376 | A1* | 10/2008 | Irie | C08F 220/22 430/285.1 |
| 2010/0046079 | A1* | 2/2010 | Yoon | B81C 1/0015 359/619 |
| 2012/0082939 | A1* | 4/2012 | Kawabata | C08F 220/38 430/319 |
| 2012/0291668 | A1* | 11/2012 | DiPietro | B82Y 10/00 106/287.21 |
| 2016/0062242 | A1* | 3/2016 | Hamaguchi | G03F 7/0046 174/251 |

FOREIGN PATENT DOCUMENTS

| | | | |
|---|---|---|---|
| JP | H07-022732 | A | 1/1995 |
| JP | 07-147469 | * | 6/1995 |
| JP | H08-146885 | A | 6/1996 |
| JP | 2003-114525 | A | 4/2003 |
| JP | 2003-209340 | A | 7/2003 |
| JP | 2004-098351 | A | 4/2004 |
| JP | 2005-187609 | A | 7/2005 |
| JP | 2005-202176 | * | 7/2005 |
| JP | 2005-330345 | A | 12/2005 |
| JP | 2006-058797 | A | 3/2006 |
| JP | 2008-275949 | * | 11/2008 |
| JP | 2009-224381 | A | 10/2009 |
| JP | 2010-159350 | A | 7/2010 |
| JP | 2011-178006 | A | 9/2011 |
| JP | 2011-241309 | A | 12/2011 |
| JP | 2012-218318 | A | 11/2012 |
| JP | 2012-232434 | A | 11/2012 |

OTHER PUBLICATIONS

Machine translation of JP 2005-202176 (2005).*
Machine translation of JP 2008-275949 (2008).*
Ito et al. "Chemical amplification in the design of dry developing resist materials", Poly. Eng. Sci., vol. 23(18) pp. 1012-1018 (Dec. 1983).*
Internal Search Report dated Jun. 2, 2015, in PCT/JP2015/056652 filed Mar. 6, 2015.

* cited by examiner

PROCESS FOR PRODUCING SUBSTRATE HAVING WIRING, RADIATION-SENSITIVE COMPOSITION, ELECTRONIC CIRCUIT AND ELECTRONIC DEVICE

CROSS-REFERENCE TO RELATED APPLICATIONS

The present application is a continuation-in-part application of International Application No. PCT/JP2015/056652, filed Mar. 6, 2015, which claims priority to Japanese Patent Application No. 2014-52235, filed Mar. 14, 2014. The contents of these applications are incorporated herein by reference in their entirety.

BACKGROUND OF THE INVENTION

Field of the Invention

The present invention relates to a process for producing a substrate having wiring, a radiation-sensitive composition, an electronic circuit and an electronic device.

Discussion of the Background

For electronic devices including liquid crystal displays, mobile information devices such as mobile phones and tablets, digital cameras, organic EL displays, organic EL lights and sensors, there has been demand for their downsizing and thinning and providing them with higher performance. Processes for more inexpensively producing those electronic devices that have been attracting attention are printed electronics in which wiring is directly printed. The printing processes for the production of electronic parts can usually skip multi-stage steps including exposing and developing and a vacuum step such as vapor deposition, and therefore are expected to significantly simplify processes.

The printing processes, such as inkjet printing, screen printing, gravure printing and gravure offset printing, enable wiring with a desired pattern to be directly formed on a substrate, and thus are employed as simplified processes incurring lower cost. Yet, the formation of the wiring with a desired pattern involves the wiring-forming materials flowing leading to wet-spreading and bleeding. Thus, conventional art has faced limitation for the formation of fine patterns excellent in linearity.

Meanwhile, in the use of wiring-forming materials for patterning by printing, it has been actively studied to form the metal wiring by thermal calcination or photo calcination (for example, see JP-A-2011-241309). This technique still cannot overcome the wet-spreading and bleeding of the material at the time of printing and is inadequate in the adhesion between the resultant wiring and the substrate.

In order to solve the above problems and thereby enable high-definition printing and to form a high-definition wiring, it has been studied to provide a layer serving as foundation (foundation layer) for the wiring. The foundation treatment for the provision of the foundation layer is often performed for the purpose of inhibiting the wiring-forming material applied on the substrate from wet-spreading, bleeding or the like and thereby improving printability.

The foundation treatment methods that are known include a method in which the grafting of an epoxy group is performed with respect to a substrate (for example, see JP-A-2003-114525 and JP-A-2006-58797); a method in which a photocatalyst is applied on a substrate (for example, see JP-A-2003-209340 and JP-A-2004-98351); and a method in which an acrylic copolymer is applied on a substrate (for example, see JP-A-2012-232434 and JP-A-2012-218318).

However, the conventional foundation treatments for the provision of the foundation layer is insufficient in inhibiting the wiring-forming material from wet-spreading and bleeding, and therefore the formation of a high-definition wiring has been difficult. For example, under the conventional foundation treatments, properties of surfaces of the foundation layer on which the wiring-forming material is applied are uniform, and thus it is unsuccessful to sufficiently inhibit the wiring-forming material printed with a prescribed pattern from wet-spreading immediately after its printing.

SUMMARY OF THE INVENTION

According to one aspect of the present invention, a process for producing a substrate having wiring includes steps (i) to (v) described below.

(i) applying a radiation-sensitive composition on a substrate to form a coating film, (ii) irradiating a prescribed part of the coating film with radiation to allow the coating film to have a radiation-irradiated region and a radiation-unirradiated region, (iii) allowing the coating film obtained in the step (ii) to have a concave region and a convex region, (iv) forming wiring on the concave region, and (v) removing the convex region by an application of radiation or by heating.

Another aspect of the present invention relates to a radiation-sensitive composition for use in the production process.

Still another aspect of the present invention relates to an electronic circuit that includes the substrate having wiring produced by the production process.

Still another aspect of the present invention relates to an electronic device that includes the electronic circuit.

DESCRIPTION OF THE EMBODIMENTS

Figure 1:
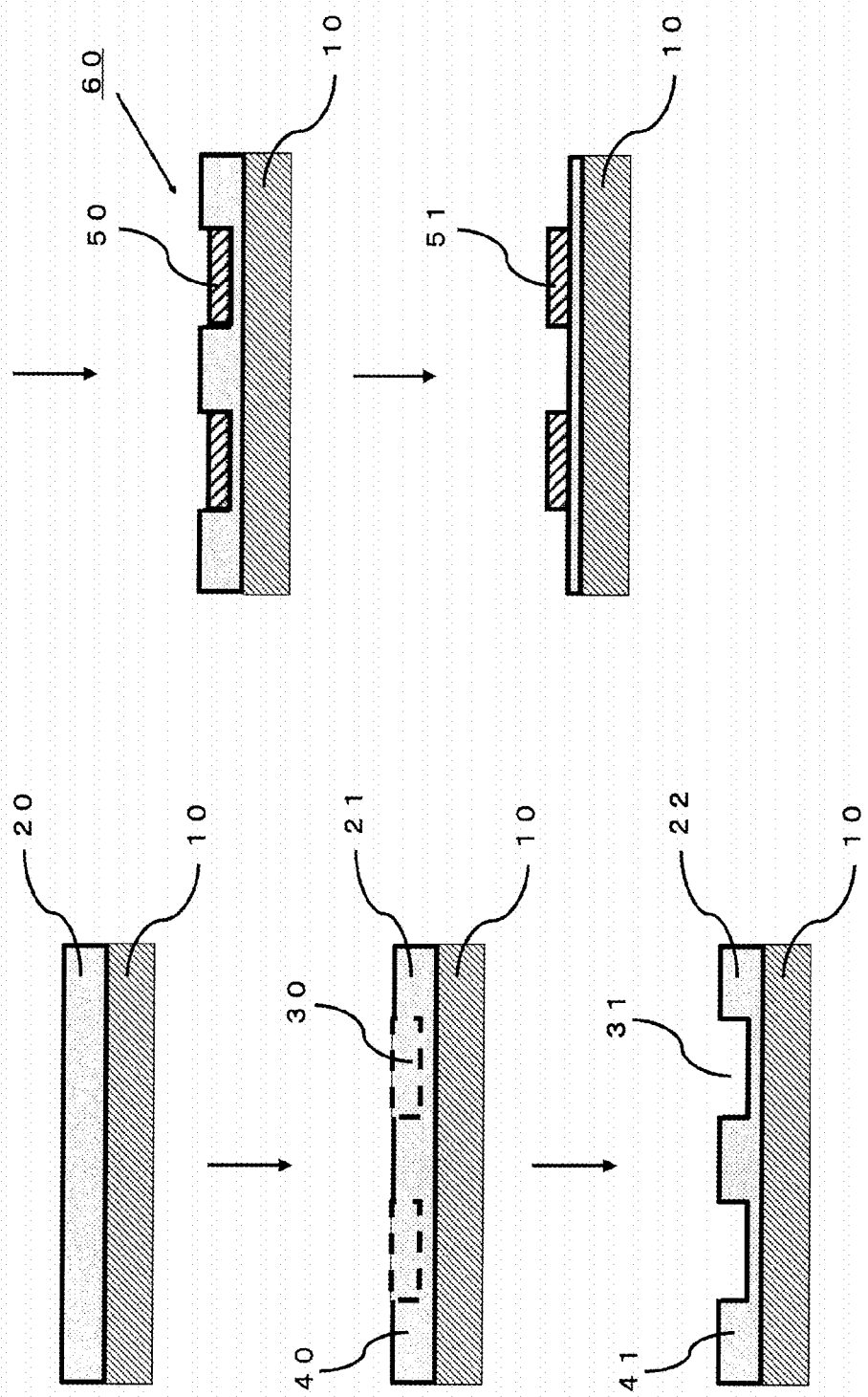
FIG. 1 is a cross-sectional schematic view showing an embodiment of a process for producing a substrate having wiring according to the present invention.

The embodiments of the present invention are given below.

[1] A process producing a substrate having wiring comprising steps (i) to (v) described below:

(i) applying a radiation-sensitive composition on a substrate to form a coating film, (ii) irradiating a prescribed part of the coating film with radiation to allow the coating film to have a radiation-irradiated region and a radiation-unirradiated region, (iii) allowing the coating film obtained in the step (ii) to have a concave region and a convex region, (iv) forming wiring on the concave region, and (v) removing the convex region by an application of radiation or by heating.

[2] The production process according to [1], wherein the radiation-sensitive composition is a composition comprising a compound having an acid-dissociable group and an acid generator.

[3] The production process according to [1] or [2], wherein the step (iii) is allowing the coating film obtained in the step (ii) to have the concave region and the convex region by heating the coating film obtained in the step (ii).

[4] The production process according to any one of [1] to [3], wherein the step (iv) is applying a wiring-forming material on the concave region obtained in the step (iii) and thereafter heating the wiring-forming material and/or irradiating the wiring-forming material with radiation.

[5] The production process according to any one of [2] to [4], wherein the acid-dissociable group has a fluorine atom.

[6] The production process according to any one of [1] to [5], wherein a difference between a surface of the concave region and a surface of the convex region in contact angle with respect to tetradecane is 30° or more.

[7] The production process according to any one of [1] to [6], wherein the concave region has a film thickness that is reduced by 10% or more as compared with a film thickness of the convex region.

[8] The production process according to any one of [2] to [7], wherein the acid-dissociable group is a group containing at least one bond selected from the group consisting of an acetal bond and a hemiacetal ester bond.

[9] The production process according to [8], wherein the group containing at least one bond selected from the group consisting of an acetal bond and a hemiacetal ester bond has at least one group selected from the group consisting of groups represented by Formula (1-1) and groups represented by Formula (1-2):

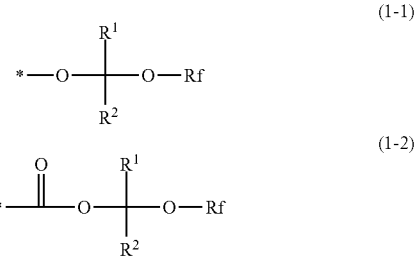

wherein in Formulae (1-1) and (1-2), $R^1$ and $R^2$ are each independently a hydrogen atom or a methyl group; Rf are each independently an organic group having a fluorine atom; and * is a bonding site.

[10] The production process according to any one of [1] to [9], wherein the radiation-sensitive composition comprises a polymerizable compound having an ethylenic unsaturated bond.

[11] The production process according to any one of [2] to [10], wherein the compound having an acid-dissociable group comprises at least one unit selected from the group consisting of structural units represented by Formulae (2) to (6):

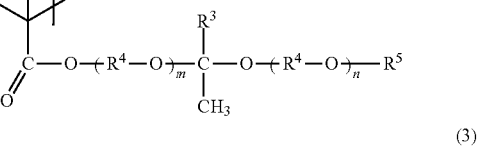

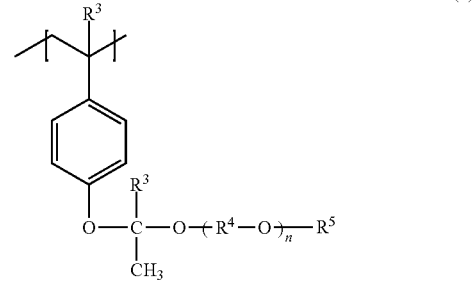

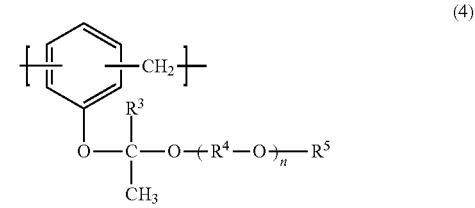

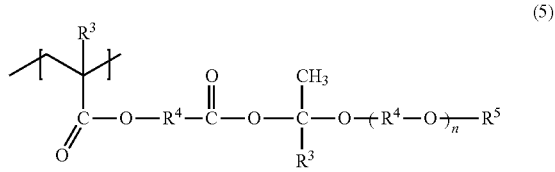

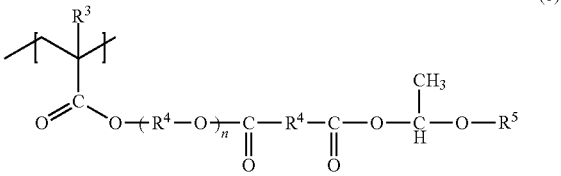

wherein in Formulae (2) to (6), $R^3$ are each independently a hydrogen atom or a methyl group; $R^4$ are each independently a methylene group, a C2-12 alkylene group, a C2-12 alkenylene group, a C6-13 substituted or unsubstituted aromatic hydrocarbon group, a C4-12 substituted or unsubstituted alicyclic hydrocarbon group, or a group in which at least one hydrogen atom of these groups is substituted with a fluorine atom; $R^5$ are each independently a group in which at least one hydrogen atom of a hydrocarbon group is substituted with a fluorine atom; m is 0 or 1; and n are each independently an integer of from 0 to 12.

[12] A radiation-sensitive composition for use in the production process according to any one of [1] to [11].

[13] An electronic circuit comprising the substrate having wiring produced by the production process according to any one of [1] to [11].

[14] An electronic device comprising the electronic circuit according to [13].

The embodiments of the present invention prevent a wiring-forming material from wet-spreading and bleeding, and can easily produce a high-definition wiring. Also, wiring excellent in adhesion onto a substrate can be produced.

<<Process for Producing Substrate Having Wiring>>

A process for producing a substrate having wiring according to the embodiments of the present invention includes steps (i) to (v) described below:

(i) a step of applying a radiation-sensitive composition on a substrate to form a coating film, (ii) a step of irradiating a prescribed part of the coating film with radiation to allow the coating film to have a radiation-irradiated region and a radiation-unirradiated region, (iii) a step of allowing the coating film obtained in the step (ii) to have a concave region and a convex region, (iv) a step of forming wiring on the concave region, and (v) a step of removing the convex region by an application of radiation or by heating.

According to the production process in the embodiments of the present invention, a high-definition wiring can be easily produced, and wiring with a width of 10 μm or less, for example, even wiring with a width of about 1 μm, which has not been easily producible according to conventional methods, can be easily produced.

According to the production process in the embodiments of the present invention, a foundation layer (a coating film obtained from the radiation-sensitive composition) can be formed without the production process including a development step necessary to conventional methods for forming the foundation layer.

In the embodiments of the present invention, a high-definition refers to wiring width of not more than 50 μm of wiring (pattern).

As used throughout this disclosure, the singular forms "a," "an," and "the" include plural reference unless the context clearly dictates otherwise.

[Step (i)]

In the step (i), the radiation-sensitive composition is applied on a substrate, and thereafter preferably the coated surface is heated (prebaked), to form a coating film. Preferably, the substrate is coated with the composition containing a compound having an acid-dissociable group and an acid generator to form the coating film.

The use of the radiation-sensitive composition in the step (i) eliminates the need to perform a development step in e.g., the step (iii) described below, in order to form the concave region on the substrate.

The radiation-sensitive composition will be specifically described later.

Materials of the substrate employable include glass, quartz, silicon and resins. Specific examples of the resins include polyethylene terephthalate, polybutylene terephthalate, polyethylene naphthalate, polyether sulphones, polycarbonates, polyimides, ring-opening polymers of cyclic olefins (ROMP polymers) and their hydrogenation products.

Since a substrate having wiring eventually obtained by the production process in the embodiments of the present invention is preferably used as it is for electronic circuits and the like, the substrate is preferably a resin substrate, a glass substrate, or a semiconductor substrate, which has been conventionally used for electronic circuits.

Before the application of the radiation-sensitive composition on the substrate, a surface of the substrate surface may undergo a pretreatment, as needed, such as washing, roughening, and imparting of finely uneven surfaces.

Application method of the radiation-sensitive composition, which is not particularly limited, may be for example, coating method using a paintbrush or a brush, dipping method, spraying method, roll coating method, rotation coating method (spin coating method), slit die coating method, bar coating method, flexographic printing, offset printing, inkjet printing, dispensing method or the like that is an appropriate. Of these coating methods, particularly preferred is slit die coating method or spin coating method.

The coating film formed in the step (i) has a thickness which may be adjusted appropriately according to a desired use but is preferably 0.1 to 20 μm, and more preferably 0.2 to 10 μm.

The prebaking is performed under conditions, which differ depending on factors such as a formulation of radiation-sensitive composition used, that are preferably a temperature of about 60° C. to 120° C. for about 1 minute to 10 minutes.

[Step (ii)]

In the step (ii), at least part of the coating film formed in the step (i) is irradiated with radiation to undergo exposure.

In the step (ii), as shown in FIG. 1, part of a coating film 20 on a substrate 10 is irradiated with radiation, so that a coating film 21 has radiation-irradiated regions 30 and radiation-unirradiated regions 40.

In cases where the radiation-sensitive composition used in the step (i) is a composition containing a compound having an acid-dissociable group and an acid generator, performing the step (ii) causes the acid-dissociable group to be affected by the acid generator and be eliminated and volatilize, and as a result causes the radiation-irradiated region to have a film thickness which is reduced as compared with a film thickness of the radiation-unirradiated region, leading to the formation of a concave pattern (the change of the film thickness is not clearly illustrated in FIG. 1). At this time, when the acid-dissociable group has a fluorine atom, the coating film obtained in the step (i) and the radiation-unirradiated region exhibits liquid-repellency, whereas the radiation-irradiated region becomes lyophilic as compared with the radiation-unirradiated region as the acid-dissociable group disappears.

Thus, in cases where the radiation-sensitive composition used in the step (i) is a composition that contains a compound containing an acid-dissociable group having a fluorine atom, performing the step (ii) causes the coating film to have, on the substrate, the liquid-repellent radiation-unirradiated region, and the radiation-irradiated region, i.e., the concave pattern lyophilic as compared with the radiation-unirradiated region.

In the step (ii), in such a manner that the radiation-irradiated region with the same shape as a shape desired for wiring will be formed, a prescribed pattern can be drawn by exposure with via a photo mask having the prescribed pattern or with a direct drawing exposure apparatus.

For the application of radiation, it is preferred, from viewpoint such as forming a high-definition wiring, for radiation to be applied both from the coating film formed in the step (i) side and from the direction substantially vertical to the coating film surface.

Examples of the radiation for exposure in the embodiments of the present invention include visible ray, ultraviolet ray, far ultraviolet ray, charged particle ray and X-ray. Of these radiations, radiations having a wavelength in the range from 190 nm to 450 nm are preferable, and radiations including an ultraviolet ray having a wavelength of 365 nm are particularly preferable.

For the exposure quantity in the step (ii), it is preferred that the radiation exposure is performed so as to provide the film thickness described later of the concave regions obtained through the step (iii): specifically, the radiation has an intensity at a wavelength of 365 nm as measured with an illuminometer (OAI model 356, manufactured by OAI- OPTICAL ASSOCIATES INC.), which is preferably 10 mJ/cm² to 1000 mJ/cm², and more preferably 20 mJ/cm² to 500 mJ/cm².

[Step (iii)]

The step (iii) is not particularly limited as long as being a step of allowing the coating film obtained in the step (ii) to have concave regions 31 and convex regions 41. The step (iii) is preferably a step of allowing a coating film 22 to have the concave regions 31 and the convex regions 41 by heating the coating film obtained in the step (ii). In the step (iii) preferred, the coating film obtained in the step (ii) is heated to form the coating film having the concave region corresponding to the radiation-irradiated region that were produced in the step (ii) and the convex region corresponding to the radiation-unirradiated region that were produced in the step (ii).

In cases where the radiation-sensitive composition used in the step (i) is a composition containing a compound having an acid-dissociable group and an acid generator, performing the step (iii) causes a further volatilization of the component produced in the radiation-irradiated region of the step (ii) as a result of the acid-dissociable group being affected by the acid generator and being eliminated, consequently further deepening the concave depression that has been made at the radiation-irradiated region (further reducing the film thickness of the concave region). This results in providing a coating film in which the concave region has a film thickness that is reduced by 10% or more as compared with a film thickness of the convex region.

In cases where the radiation-sensitive composition used in the step (i) is a composition containing a compound with a chemical bond severable by the application of radiation, the chemical bond present in the compound in the coating film is severed by the application of radiation performed in the step (ii), and moreover the heating in the step (iii) can cause the compound severed to be efficiently removed, which leads to the formation of the concave region and the convex region.

Specific examples of the compound whose chemical bond is severable by the application of radiation are those with a chemical bond severable by the application of radiation including a wavelength from 150 to 450 nm, preferably by the application of radiation including a short wavelength from 150 to 365 nm, at 0.5 to 5 J/cm².

In cases where the radiation-sensitive composition used in the step (i) is a composition containing a component which by the application of radiation allows photocrosslinking to occur and with the crosslinking allows curing shrinkage or the like to occur, the concave pattern produced in the step (ii), by being heated in the step (iii), can further be deepened for the formation of the concave region and the convex region.

In cases where the radiation-sensitive composition used in the step (i) is a composition that contains a compound containing an acid-dissociable group having a fluorine atom, performing the step (iii) allows the coating film to have, on the substrate, the liquid-repellent convex region and the concave region lyophilic as compared with the convex region. Coating such a coating film with a wiring-forming material in the form of liquid, with the film thickness difference being large between the convex region and the concave region, allows the material to easily gather on the concave region due to the concave and convex surfaces of the coating film. Not just the surface shape of the coating film but also the lyophilicity and liquid-repellency of the surface make it easier for the material to gather on the concave region, and thereby facilitate the formation of wiring with more desired shape, specifically a higher-definition wiring.

In cases where the radiation-sensitive composition used in the step (i) is a composition that contains a compound containing an acid-dissociable group having a fluorine atom, the application of radiation causes the group having a fluorine atom to be eliminated. Since the eliminating group volatilizes relatively with ease, it is possible in the step (iii) to more easily form a coating film with a film thickness difference large between the convex region and the concave region.

The coating film heating method that can be employed in the step (iii) may be performed, for example, by subjecting the substrate with the coating film obtained in the step (ii) to a method using a hot plate, a batch-type oven, a conveyor-type oven or the like, to hot-air drying using a dryer or the like, or to vacuum baking.

The heating is performed under conditions, which differ depending on factors such as a formulation of radiation-sensitive composition used in the step (i) and a thickness of the coating film obtained in the step (ii), preferably of a temperature of 60 to 150° C. for about 3 to 30 minutes.

In the step (iii), it is desired that the coating film is formed with the concave region having a film thickness that is preferably reduced by 10% or more, more preferably by 11% or more, still more preferably 12 to 70%, as compared with a film thickness of the convex region.

By the resultant coating film having such a shape as described above, the application of the wiring-forming material on the concave region, due to the unevenness created by the concave and convex surfaces of the coating film, leads to the material being inhibited from flowing out from the concave region as well as the material being inhibited from remaining on the other regions than the concave region. This makes it possible to apply a large amount of the wiring-forming material, and even the use of a large amount of the wiring-forming material can produce a high-definition wiring.

The film thicknesses of the concave region and the convex region are measurable specifically by a method described in Examples provided later.

The film thickness of the concave region obtained in the step (iii), which can be adjusted according to a desired use, is preferably 0.01 to 18 µm, and more preferably 0.05 to 15 µm.

The difference between the surface of the concave region and the surface of the convex region in contact angle with respect to tetradecane (contact angle of a surface of the convex region—contact angle of a surface of the concave region) is preferably 30° or more, more preferably 40° or more, still more preferably 50° or more. By the difference in contact angle falling within in the above range, at the time wiring is formed in the step (iv) described below, the liquid wiring-forming material applied even on the surface of the convex region is repelled on the convex region serving as the liquid-repellent region, and easily moves to the concave region serving as the lyophilic region. Thereby, the wiring can be formed along the concave region.

The difference in contact angle is measurable specifically by a method described in Examples provided later.

Figure 2:
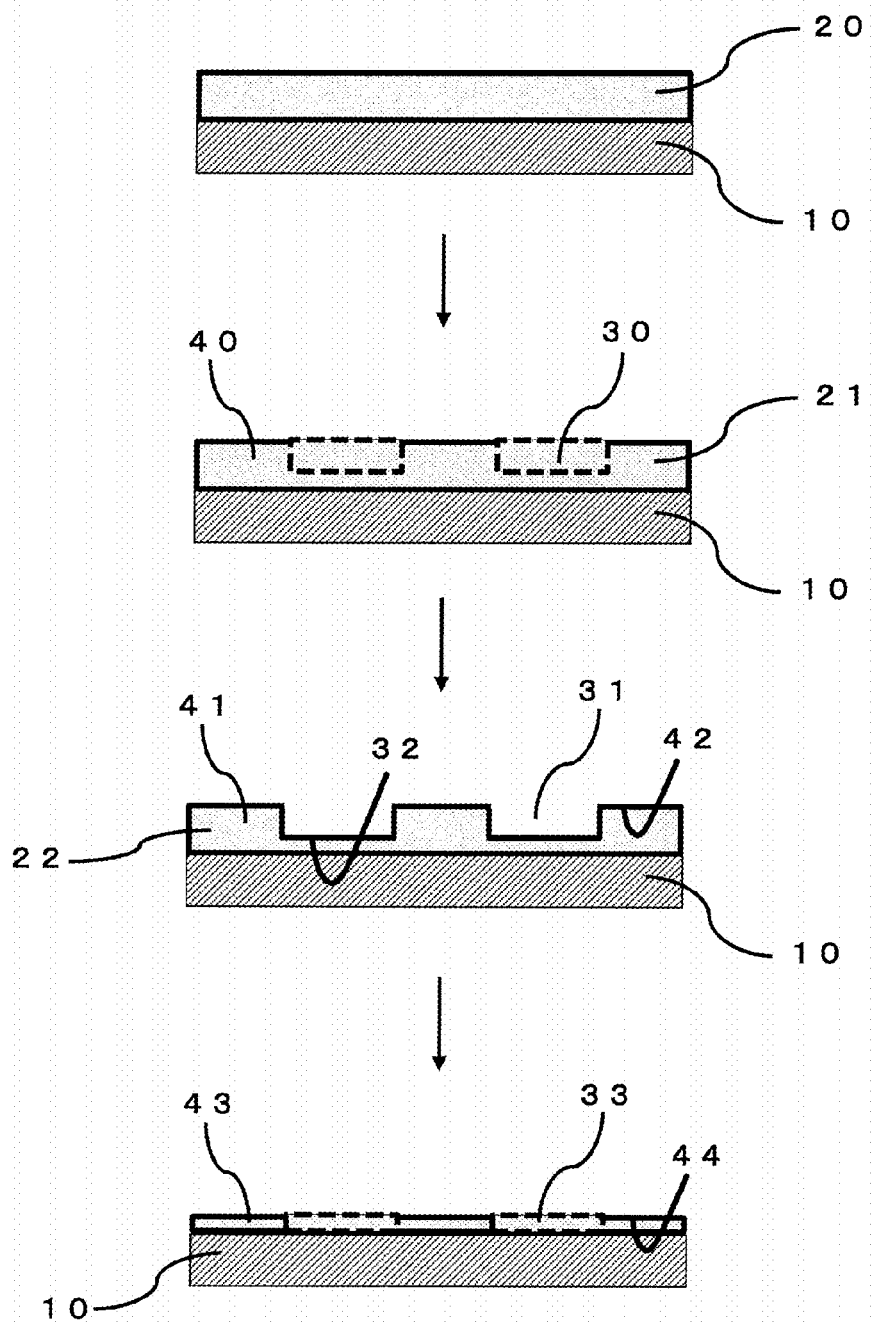
FIG. 2 is a cross-sectional schematic view showing test for studying removability of periphery of concave pattern performed in Examples.

The surface of the concave region and the surface of the convex region refer to surfaces which are of the coating film formed on the substrate and which are opposite to surfaces facing the substrate, as shown in 32 and 42 of FIG. 2, respectively.

Tetradecane is used in the measurement of the contact angle because tetradecane is commonly used in wiring-forming materials and hardly volatilizes and therefore is suited for the measurement of the contact angle.

When the resultant concave region and convex region fulfill a requirement that a film thickness of the concave region is reduced as compared with a film thickness of the convex region by 10% or more, and that the difference between a surface of the concave region and a surface of the convex region in contact angle with respect to tetradecane is 30° or more, a large amount of wiring-forming material can be disposed easily only on the concave region, for the same reason as mentioned above.

[Step (iv)]

In the step (iv), wiring 50 is formed on the concave region to form a substrate 60 having wiring. The step (iv) is preferably a step of applying a wiring-forming material on the concave region obtained in the step (iii) and thereafter heating the wiring-forming material and/or irradiating the wiring-forming material with radiation.

The wiring-forming material used in the formation of the wiring will be specifically described later.

The coating method, which is not particularly limited, may be for example: coating method using a paintbrush or a brush, dipping method, spraying method, roll coating method, rotational coating method (spin coating method), slit die coating method, bar coating method, squeegeeing method, flexographic printing, offset printing, ink jet printing, dispensing method or another method that is appropriate. Particularly preferred methods among these are dipping method, spraying method, spin coating method, slit die coating method, offset printing method, ink jet printing, and dispensing method.

The offset printing is preferable from viewpoints such as forming wiring that is fine and thick and has low resistivity and hardly breaks. The offset printing can be performed based on descriptions provided in, for example, JP-A-2010-159350 and JP-A-2011-178006.

In cases where the radiation-sensitive composition used in the step (i) is a composition that contains a compound containing an acid-dissociable group having a fluorine atom, the coating film obtained in the step (iii) has the liquid-repellent convex region and the concave region lyophilic as compared with the convex region, and thus under any of the methods listed above, the wiring-forming material in the form of liquid is repelled on the convex region, and easily gathers on the concave region, ending up being applied along the concave region.

The heating temperature, which is not particularly limited, is preferably not higher than 190° C. In cases where the substrate is a film with poor heat resistance, such as polyethylene terephthalate, the heating temperature is preferably not higher than a heat-resistant temperature of the film, specifically not higher than 150° C.

The heating time, which is not particularly limited, is preferably 1 to 120 minutes, and more preferably 3 to 60 minutes.

Examples of the heating method include a method using a hot plate, a batch-type oven, a conveyor-type oven or the like, a hot-air drying method using a dryer or the like, and a vacuum baking method.

Conditions for the application of radiation are not particularly limited, but the exposure quantity is preferably 10 to 1000 mJ/cm$^2$, and more preferably 20 to 500 mJ/cm$^2$.

[Step (v)]

In the step (v), the convex region is removed from the substrate 60 having wiring obtained in the step (iv) by the application of radiation or by heating. The removal meant here, as shown in FIG. 1, is a removal operation which is performed in the substrate 60 having wiring obtained in the step (iv) to such a degree as to cause a thickness of the convex regions 41 obtained in the step (iii) of the coating film obtained from the radiation-sensitive composition to become substantially the same as a thickness of the concave regions 31, and does not necessarily mean a removal operation performed until the convex regions 41 completely disappear. Through the step (v), provided is a substrate with a laminate of the coating film formed from the radiation-sensitive composition and wiring 51 formed thereon.

The step (v) is preferably (a) a step of heating performed at a temperature exceeding the heating temperature in the step (iv), or (b) a step of irradiating the convex region of the wiring-having substrate obtained in the step (iv) with radiation under the same conditions as in the step (ii) and thereafter heating performed under the same conditions as in the step (iii). Heating the wiring-forming material and/or irradiating the wiring-forming material with radiation in the step (iv) can sometimes cause the convex region to be removed; in this case, heating the wiring-forming material and/or irradiating the wiring-forming material with radiation in the step (iv) may be the step (v).

The step (v) is preferably a step of removing the convex region such that the convex region present through the step (iv) has a film thickness which is not more than a film thickness of the concave region.

Examples of the heating method in the step (v) include a method using a hot plate, a batch-type oven, a conveyor-type oven or the like, a hot-air drying method using a dryer or the like, and a vacuum baking method.

The atmosphere under which the heating is performed, which is not limited and may be appropriately selected according to a type of a wiring-forming material to be used, may be air, reduced pressure, a non-oxidizing atmosphere, or a reducing atmosphere. Examples of the non-oxidizing atmosphere include a nitrogen atmosphere, a helium atmosphere, and an argon atmosphere. Preferred among these is a nitrogen atmosphere, since a nitrogen gas, which is inexpensive, can be used. An example of the reducing atmosphere is a reducing gas atmosphere such as a hydrogen gas.

Conditions for heating in the (a), in view of the wiring-forming material and the substrate to be used, are preferably such a temperature as allows the convex region to decompose or volatilize, which is preferably 120 to 300° C., and more preferably 150 to 250° C.

The heating time in the (a) is not particularly limited as long as being a temperature allowing the convex region to decompose or volatilize. For example, when the temperature of the heating is set at around 250° C., the heating time is preferably about 3 minutes to 15 minutes; when the temperature of the heating is set at around 200° C., the heating time is preferably about 5 minutes to 30 minutes; and when the temperature of the heating is set at around 150° C., the heating time is preferably 10 minutes to 60 minutes.

<<Electronic Circuit and Electronic Device>>

The electronic circuit in the embodiments of the present invention has the wiring produced by the above production process, and preferably has the laminate of the wiring produced by the above wiring production process and the substrate.

In the electronic circuit in the embodiments of the present invention, the laminate of the wiring produced by the above production process and the substrate may further have a conventionally known layer stacked thereon, such as a film for protecting the wiring and an insulating film.

The electronic device in the embodiments of the present invention has the above electronic circuit, so that the electronic device can be downsized, be made thinner and have a higher performance.

Examples of the electronic device include liquid crystal displays, portable information devices such as mobile phones, digital cameras, organic displays, organic EL lightings, various sensors, and wearable devices.

[Radiation-Sensitive Composition]

The radiation-sensitive composition, which is not particularly limited, is preferably a composition capable of providing a coating film part of which will volatilize or decompose by the application of radiation and by heating, and is more preferably a composition containing a compound having an acid-dissociable group (hereinafter also referred to as the "compound [A]") and an acid generator (hereinafter also referred to as the "acid generator [C]").

Such a radiation-sensitive composition can be suitably used as a foundation layer-forming composition for forming a high-definition pattern with the bleeding of the wiring-forming material inhibited from occurring on the substrate, and as a foundation layer-forming composition for improving the adhesion between the wiring and the substrate.

The composition may further contain a solvent (hereinafter also referred to as the "solvent [B]"). The inclusion of the solvent [B] in the composition allows the composition to be in the form of liquid, and accordingly the composition can be applied by coating to easily form a coating film.

The composition may further contain a sensitizer (hereinafter also referred to as the "sensitizer [D]") as a material assisting the acid generator [C], and may further contain a quencher (hereinafter also referred to as the "quencher [E]") as a material for inhibiting the diffusion of acid from the acid generator [C].

The composition may contain a polymerizable compound having an ethylenic unsaturated bond (hereinafter also referred to as the "polymerizable compound [F]") other than the compound [A], and may contain a radiation-sensitive polymerization initiator (hereinafter also referred to as the "radiation-sensitive polymerization initiator [G]").

The composition may contain other optional components in a range not detrimental to effects of the present invention.

The viscosity (temperature: 20° C., shear rate: 10 sec$^{-1}$) of the composition can be adjusted in view of factors such as a desired coating method and a desired film thickness of a coating film. In cases where a coating film with a film thickness of 0.5 to 2 μm is to be formed and the coating method is spin coating method, the viscosity is, for example, preferably 5 cP (0.003 Pa·s) to 20 cP (0.02 Pa·s). In cases where the coating method is slit die coating method, the viscosity is, for example, preferably 1 cP (0.001 Pa·s) to 20 cP (0.01 Pa·s).

<Compound [A] Having an Acid-Dissociable Group>

The compound [A] is not particularly limited as long as being a compound containing a group capable of dissociating by an acid, but is preferably a polymer having such a group.

The acid-dissociable group is preferably a group containing a fluorine atom. By the compound [A] having such a group, a liquid-repellent coating film can be formed in the step (i); by the coating film undergoing the subsequent steps including the step (ii), the liquid-repellent convex region and the concave region lyophilic as compared with the convex region can be easily formed; and by the coating film undergoing the subsequent steps including the step (iv) or (v), a high-definition wiring can be produced.

The acid-dissociable group, from viewpoints such as producing a high-definition wiring, is more preferably a group having a group containing at least one bond selected from the group consisting of an acetal bond and a hemiacetal ester bond. Such a group is particularly preferably at least one group selected from the group consisting of a group represented by Formula (1-1) and a group represented by Formula (1-2) that are provided below.

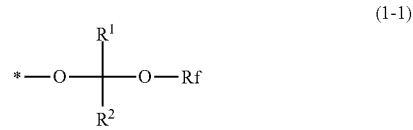

(1-1)

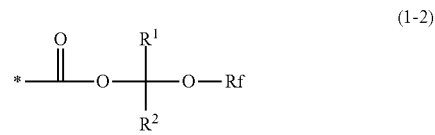

(1-2)

In Formulae (1-1) and (1-2), $R^1$ and $R^2$ are each independently a hydrogen atom or a methyl group; Rf are each independently an organic group having a fluorine atom; and * represents a bonding site.

The acetal bond-containing compound is obtainable by allowing an alcohol to react with a compound having a group: $CH_2=C(R^1)-O-$. The hemiacetal ester bond-containing compound is obtainable by allowing a carboxylic acid to react with a compound having a group: $CH_2=C(R^1)-O-$.

Preferred as Rf are groups of Formulae (1-1) to (1-33), a 2,2,2-trifluoroethyl group and a 1,2,2-trifluorovinyl group.

(1-1)

(1-2)

(1-3)

(1-4)

(1-5)

(1-6)

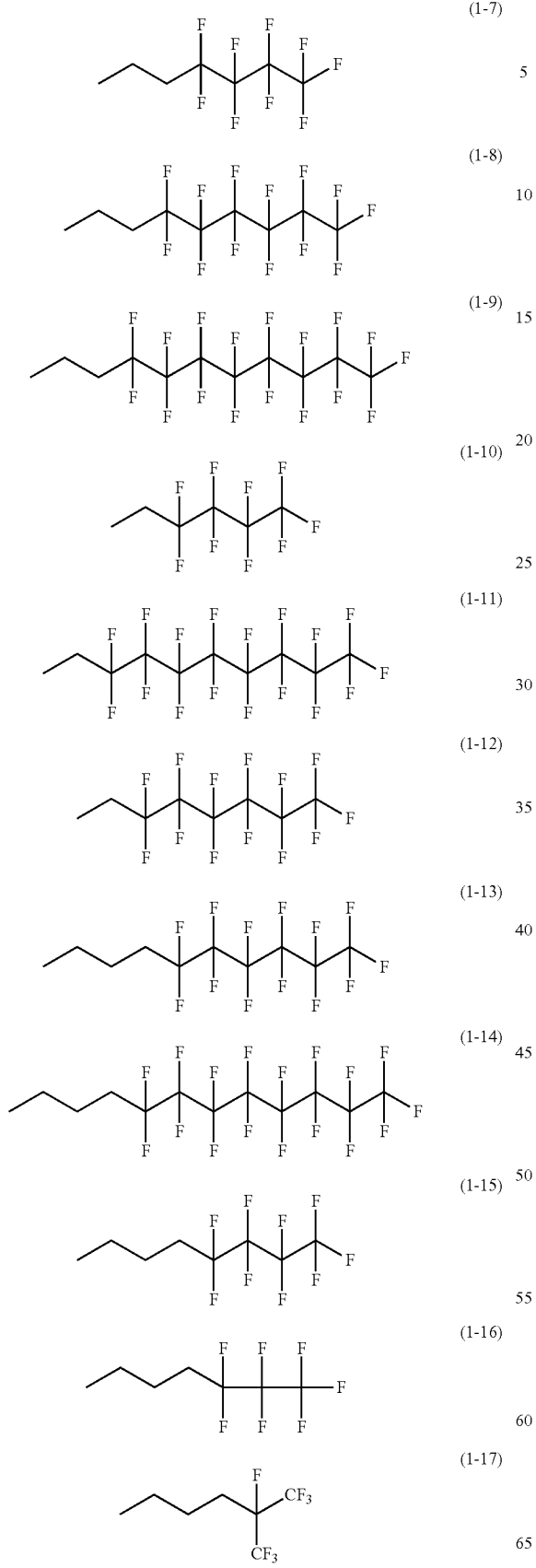
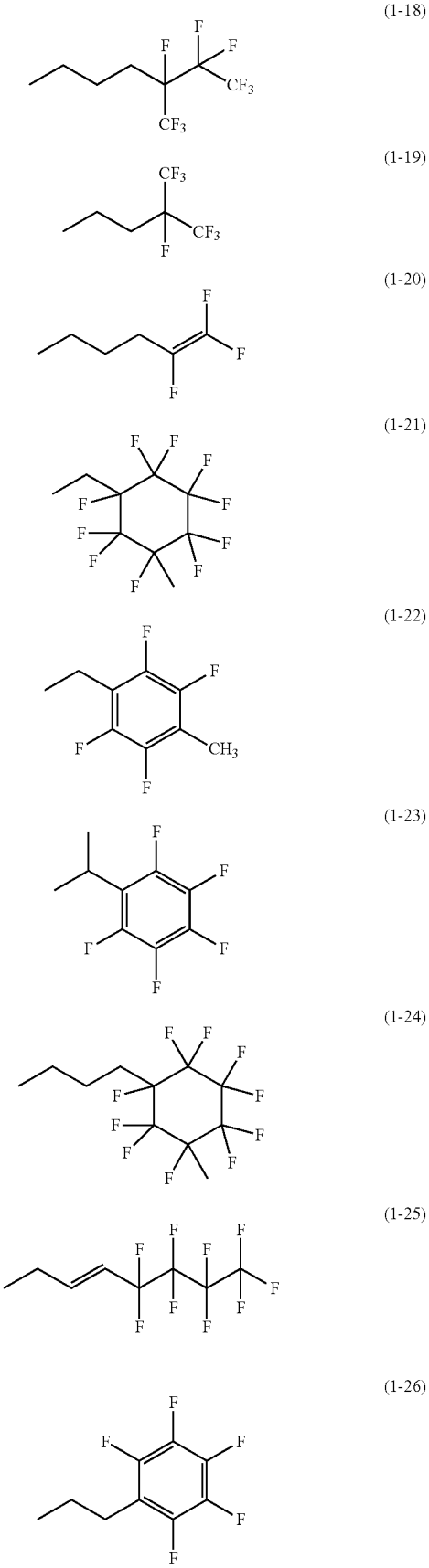

(1-27)
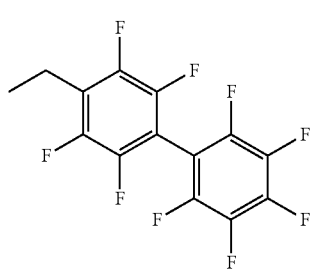

(1-28)
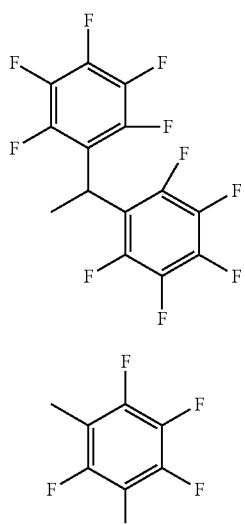

(1-30)
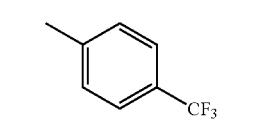

(1-31)
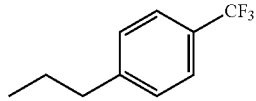

(1-32)
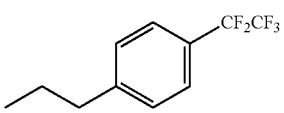

(1-33)

The compound [A] is preferably a compound having a structure given by introducing a protecting group derived from a vinyl ether compound represented by formula (1) described below (hereinafter also referred to as the "compound (1)") to a hydroxyl group of a compound having a hydroxyl group serving as a precursor. The compound [A] may be a compound having a structure given by introducing a protecting group derived from the compound (1) to a carboxyl group of a compound having a carboxyl group serving as a precursor.

The compounds having a structure given by introducing the protecting group (hereinafter also referred to as the "compound (a)"), particularly the compounds having a hydroxyl group serving as a precursor, have a nature that the elimination of the protecting group caused by heat hardly occurs, and that the elimination of the protecting group by the application of radiation can be controlled, and therefore can be suitably used as the compound [A]. The compound (a) is preferred since the combination of the compound (a) with the acid generator [C] described later makes it possible for the elimination of the protecting group caused by the application of radiation to be controlled with greater precision.

(1)
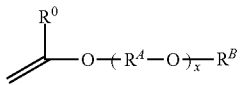

In Formula (1), $R^0$ is a hydrogen atom or a methyl group.

In Formula (1), $R^A$ are each independently a methylene group, a C2-12 alkylene group, a C2-12 alkenylene group, a C6-13 substituted or unsubstituted aromatic hydrocarbon group, a C4-12 substituted or unsubstituted alicyclic hydrocarbon group, or a group in which at least one hydrogen atom of these groups is substituted with a fluorine atom.

$R^A$ is preferably a methylene group, an ethylene group, a propylene group, a butylene group, a pentamethylene group, a hexamethylene group, a phenylene group, or a vinylene group.

In Formula (1), $R^B$ is a group in which at least one hydrogen atom of a hydrocarbon group is substituted with a fluorine atom.

In Formula (1), examples of $R^B$ include the groups represented by the Formulae (1-1) to (1-33) given as Rf, a 2, 2, 2-trifluoroethyl group, and a 1,2,2-trifluorovinyl group; preferred are a 2, 2, 2-trifluoroethyl group, a 3, 3, 3-trifluoropropyl group of the Formula (1-1), a 4,4,4-trifluorobutyl group of Formula (1-2), a 3,3,4,4,4-pentafluorobutyl group of Formula (1-4), a 4,4,5,5,6,6,6-heptafluorohexyl group of the Formula (1-16), a 3,3,4,4,5,5,6,6,7,7,8,8,8-tridecafluorooctyl group of Formula (1-8), a 1,2,2-trifluorovinyl group, and a 2,3,4,5,6-pentafluorophenyl group of Formula (1-29).

In Formula (1), x is an integer of 0 to 12, preferably an integer of 0 to 9; and more preferably 0.

Incases where the radiation-sensitive composition used in the step (i) is a composition containing the compound [A], the coating film formed in the step (i) exhibits properties attributable to the compound [A]. In cases where the compound [A] is the compound (a), the coating film exhibits properties attributable to the protecting group of the compound (a). Specifically, when the radiation-sensitive composition containing the compound (a) is used to form the coating film, the coating film that is liquid-repellent is provided in the step (i), and applying radiation to the coating film causes the protecting group to be eliminated at the exposed region with a hydroxyl group remaining and the liquid-repellency attributable to the protecting group deprived at the region from which the protecting group has been eliminated.

Next, a method for obtaining the compound [A], specifically, the compound [A] which is a polymer (hereinafter also referred to as the "polymer [A]"), will be described. The polymer [A] can be obtained by two methods: a method of using a polymer as a compound serving as a precursor, and a method of using a monomer as a compound serving as a precursor.

In the method of using a polymer as a compound serving as a precursor, the polymer serving as a precursor has a hydroxyl group or a carboxyl group in a molecule, and a hydroxyl group or a carboxyl group of the polymer serving as a precursor is allowed to react with the compound (1), so that the polymer [A] is obtainable.

In the method of using a monomer as a compound serving as a precursor, the monomer serving as a precursor has a hydroxyl group or a carboxyl group in a molecule, and a hydroxyl group or a carboxyl group of the monomer serving as a precursor is allowed to react with the compound (1), and thereafter the resultant monomer is polymerized, so that the polymer [A] is obtainable.

The two methods for obtaining the polymer [A] will be more specifically described hereinafter.

(1) Method of Using a Polymer as a Compound Serving as a Precursor

In this method, a monomer having a hydroxyl group or a carboxyl group is polymerized to give a polymer having a hydroxyl group or a carboxyl group (precursor), and thereafter a hydroxyl group or a carboxyl group of the polymer serving as a precursor is allowed to react with the compound (1), so that the polymer [A] is obtainable.

Preferred examples of the monomer having a hydroxyl group include (meth)acrylic acid esters, which include 2-hydroxyethyl (meth)acrylate, 2-hydroxypropyl (meth)acrylate, 2-hydroxybutyl (meth)acrylate, and products manufactured by DAICEL CORPORATION: Placcel FM1, Placcel FM1D, Placcel FM2D, Placcel FM3 and Placcel FM3X.

The monomers having a hydroxyl group are preferably the (meth)acrylic acid esters. Other employable compounds than the above compounds include compounds having a hydroxyl group and an unsaturated bond, such as isopropenylphenol.

The monomers having a hydroxyl group may be used singly, or two or more kinds thereof may be used.

Examples of the monomers having a carboxyl group include (meth)acrylic acid, 2-(meth)acryloyloxyethylsuccinic acid, and 2-(meth)acryloyloxyethylphthalic acid.

The monomers having a carboxyl group may be used singly, or two or more kinds thereof may be used.

The polymer having a hydroxyl group or a carboxyl group that serves a precursor of the polymer [A] may be given by using the monomer having a hydroxyl group or a carboxyl group alone, or may be given by copolymerizing the monomer having a hydroxyl group or a carboxyl group with a monomer that is not the monomer having a hydroxyl group or a carboxyl group. Examples of the monomer that is not the monomer having a hydroxyl group or a carboxyl group include (meth)acrylic acid linear alkyl esters, (meth)acrylic acid cyclic alkyl esters, (meth)acrylic acid aryl esters, unsaturated aromatic compounds, conjugated dienes, unsaturated compounds having a tetrahydrofuran skeleton, maleimides and other monomers.

Other monomers than the monomers having a hydroxyl group or a carboxyl group may be used singly, or two or more kinds thereof may be used.

More specific examples of the (meth)acrylic acid linear alkyl esters include methyl (meth)acrylate, ethyl (meth)acrylate, n-butyl (meth)acrylate, sec-butyl (meth)acrylate, t-butyl (meth)acrylate, 2-ethylhexyl (meth)acrylate, isodecyl (meth)acrylate, n-lauryl (meth)acrylate, tridecyl (meth)acrylate, and n-stearyl (meth)acrylate.

Examples of the (meth)acrylic acid cyclic alkyl esters include cyclohexyl (meth)acrylate, 2-methylcyclohexyl (meth)acrylate, tricyclo[5.2.1.0$^{2,6}$]decane-8-yl (meth)acrylate, and isobornyl (meth)acrylate.

Examples of the (meth)acrylic acid aryl esters include phenyl (meth)acrylate, and benzyl (meth)acrylate.

Examples of the unsaturated aromatic compounds include styrene, α-methylstyrene, o-methylstyrene, m-methylstyrene, p-methylstyrene, and p-methoxystyrene.

Examples of the conjugated dienes include 1,3-butadiene, isoprene, and 2,3-dimethyl-1,3-butadiene.

Examples of the unsaturated compounds having a tetrahydrofuran skeleton include tetrahydrofurfuryl (meth)acrylate, 2-(meth)acryloyloxy-propionic acid tetrahydrofurfuryl ester, and 3-(meth)acryloyloxytetrahydrofuran-2-one.

Examples of the maleimides include N-phenylmaleimide, N-cyclohexylmaleimide, N-tolylmaleimide, N-naphthylmaleimide, N-ethylmaleimide, N-hexylmaleimide, and N-benzylmaleimide.

Examples of other monomers include glycidyl (meth)acrylate, 3,4-epoxycyclohexyl (meth)acrylate, 3-((meth)acryloyloxymethyl)-3-ethyloxetane, and tricyclo[5.2.1.0$^{2,6}$]decane-8-yloxyethyl (meth)acrylate.

Examples of a solvent used for polymerization reaction aimed at synthesizing the polymer having a hydroxyl group or a carboxyl group that serves as a precursor of the polymer [A], include alcohols, glycol ethers, ethylene glycol alkyl ether acetates, diethylene glycol monoalkyl ethers, diethylene glycol dialkyl ethers, dipropylene glycol dialkyl ethers, propylene glycol monoalkyl ethers, propylene glycol alkyl ether acetates, propylene glycol monoalkyl ether propionates, ketones, and esters.

The solvents may be used singly, or two or more kinds thereof may be used.

In the polymerization reaction for obtaining the polymer having a hydroxyl group or a carboxyl group that serves as a precursor of the polymer [A], one kind of molecular weight regulator, or two or more kinds thereof, may be used in order to regulate the molecular weight.

The polymer having a hydroxyl group or a carboxyl group has a weight average molecular weight (Mw) in terms of polystyrene, as determined by gel permeation chromatography (GPC), which is preferably 1000 to 40000, more preferably 1000 to 30000, still more preferably 5000 to 30000. Controlling the polymer having a hydroxyl group or a carboxyl group to have Mw falling in the above range can increase the sensitivity of the radiation-sensitive composition containing the polymer [A] with such a molecular weight.

Next, the method of allowing a hydroxyl group or a carboxyl group of the polymer having a hydroxyl group or a carboxyl group to react with the compound (1) to obtain the polymer [A] can be performed by adding a vinyl ether group to the hydroxyl group or the carboxyl group, as illustrated in the formula below.

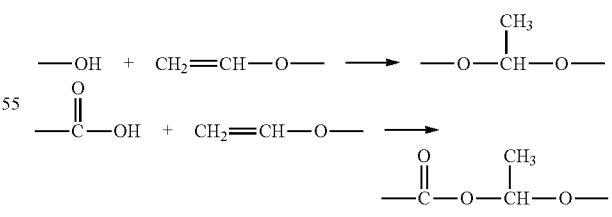

For the methods for obtaining the polymer [A], reference may be made to known methods, which are indicated, for example, in JP-A-2005-187609.

Specifically, a hydroxyl group of a polymer having a hydroxyl group is allowed to react with a vinyl ether group of the compound (1) to produce an acetal bond, or a carboxyl group of a polymer having a carboxyl group is allowed to react with a vinyl ether group of the compound (1) to produce a hemiacetal ester bond, to form an adduct.

For example, the polymer having a hydroxyl group or a carboxyl group is allowed to dissolve in an appropriate organic solvent, and thereafter the compound (1) is added at an equimolar or an excess amount with respect to a hydroxyl group or a carboxyl group of the polymer; the resultant reaction mixture is cooled from 0° C. to around room temperature (25° C.), and thereafter an acid dissolved in the same solvent as the above organic solvent (for example, an oxalic acid solution) is dropwise added as a catalyst; after the completion of the dropwise adding, the solution is stirred at room temperature for 1 to 24 hours to allow the reaction to proceed; after the completion of the reaction, and the removal of the organic solvent, the target polymer [A] is obtainable.

(2) Method of Using a Monomer as a Compound Serving as a Precursor

In this method, a hydroxyl group or a carboxyl group of the monomer having a hydroxyl group or a carboxyl group is allowed to react with the compound (1) to obtain an adduct, which is then polymerized to give the polymer [A]. For such a method for obtaining the polymer [A], reference can be made to publicly known methods. For example, as described in JP-A-2005-187609, a hydroxyl group of a monomer having a hydroxyl group is allowed to react with a vinyl ether group of the compound (1) to produce an acetal bond, or a carboxyl group of a monomer having a carboxyl group is allowed to react with a vinyl ether group of the compound (1) to produce a hemiacetal ester bond, to form an adduct. Subsequently, the resultant monomer is used to obtain the polymer [A] by the same process for producing the polymer having a hydroxyl group or a carboxyl group.

Preferred examples of the polymer [A] obtained in such a manner as described above include polymers having at least one selected from the group consisting of structural units represented by Formulae (2) to (6).

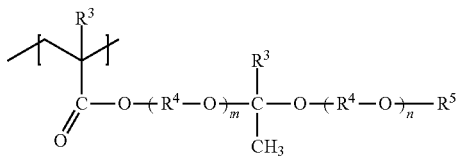

(2)

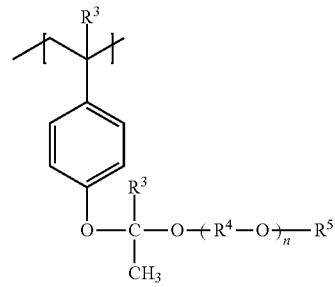

(3)

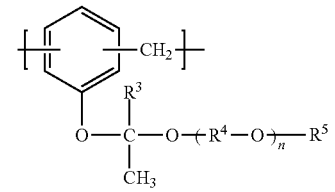

(4)

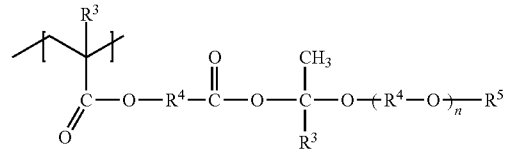

(5)

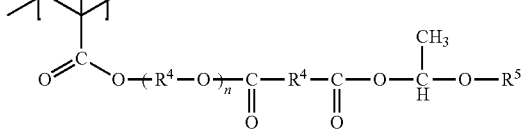

(6)

In Formulae (2) to (6), $R^3$ are each independently a hydrogen atom or a methyl group; $R^4$ are each independently a methylene group, a C2-12 alkylene group, a C2-12 alkenylene group, a C6-13 substituted or unsubstituted aromatic hydrocarbon group, a C4-12 substituted or unsubstituted alicyclic hydrocarbon group, or a group in which at least one hydrogen atom of these groups is substituted with a fluorine atom; $R^5$ are each independently a group in which at least one hydrogen atom of a hydrocarbon group is substituted with a fluorine atom; m is 0 or 1; and n are each independently an integer of from 0 to 12.

More preferable examples of the polymer [A] include polymers having at least one selected from the group consisting of structural units represented by formulae provided below.

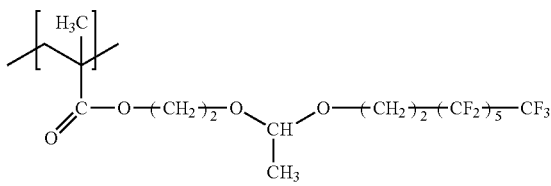

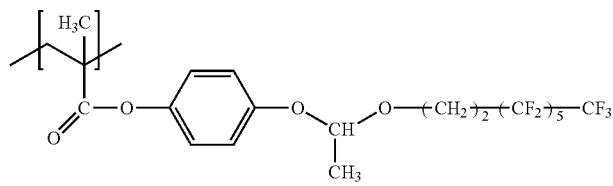

-continued

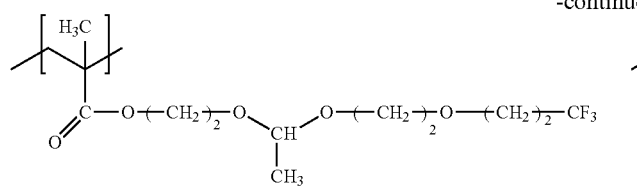

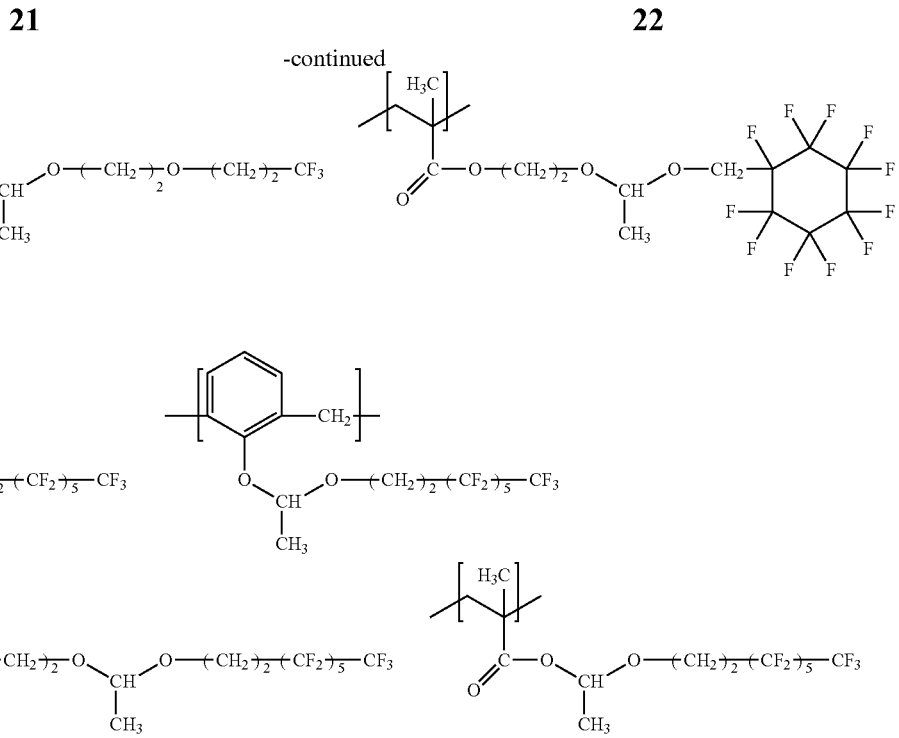

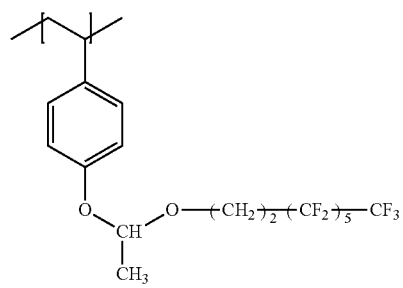

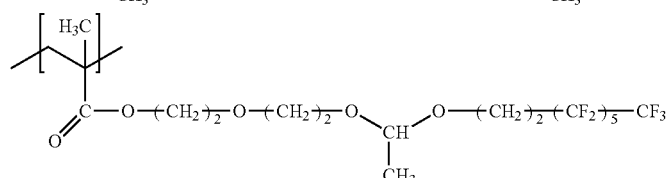

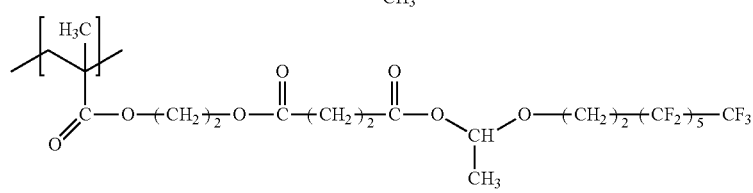

The compounds [A] may be used singly, or two or more kinds thereof may be used.

<Solvent [B]>

The solvent [B] is not particularly limited, but is preferably a solvent capable of uniformly dissolving or dispersing components including the compound [A], the acid generator [C] and the polymerizable compound [F] that are described later.

Solvents [B] preferred include alcohol solvents, ethers, diethylene glycol alkyl ethers, ethylene glycol alkyl ether acetates, propylene glycol monoalkyl ether acetates, propylene glycol monoalkyl ether propionates, aliphatic hydrocarbons, aromatic hydrocarbons, and ketones and esters.

The solvents [B] may be used singly, or two or more kinds thereof may be used.

The amount of the solvent [B] used with respect to 100 parts by mass of components of the radiation-sensitive composition except the solvent is preferably 200 to 1600 parts by mass, and more preferably 400 to 1000 parts by mass. Controlling the amount of the solvent [B] used so as to be in the above range can improve the applicability of the radiation-sensitive composition onto e.g., a glass substrate, inhibit coating unevenness (e.g., streaky unevenness, pinmark unevenness, hazy unevenness) from occurring, and provide coating films with improved uniformity of the film thickness.

<Acid Generator [C]>

The acid generator [C] is a compound which by the application of at least radiation produces an acid. The inclusion of the acid generator [C] in the radiation-sensitive composition can cause an acid-dissociable group to be eliminated from the compound [A].

Examples of the acid generator [C] include oximesulfonate compounds, onium salts, sulfonimide compounds, halogen-containing compounds, diazomethane compounds, sulfone compounds, sulfonic acid ester compounds, and carboxylic acid ester compounds.

The acid generators [C] may be used singly, or two or more kinds thereof may be used.

[Oximesulfonate Compound]

The oximesulfonate compound is preferably an oximesulfonate group-containing compound represented by Formula (5) provided below.

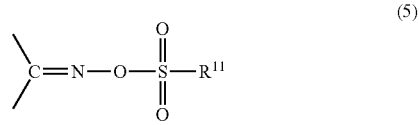

In the Formula (5), $R^{11}$ is a C1-12 alkyl group, a C1-12 fluoroalkyl group, a C4-12 alicyclic hydrocarbon group, a C6-20 aryl group, or a group in which part or whole of hydrogen atoms of the alkyl group, the alicyclic hydrocarbon group and the aryl group is substituted with a substituent.

The alkyl group represented by $R^{11}$ is preferably a C1-12 linear or branched alkyl group. The C1-12 linear or branched alkyl group may be substituted with a substituent.

Examples of the oximesulfonate group-containing compound represented by the Formula (5) include oximesulfonate compounds represented by Formula (5-1), Formula (5-2) and Formula (5-3) provided below.

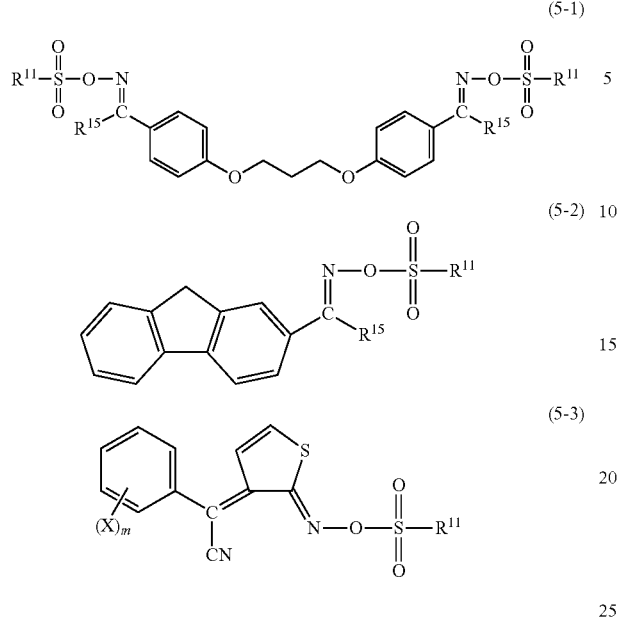

(5-1)

(5-2)

(5-3)

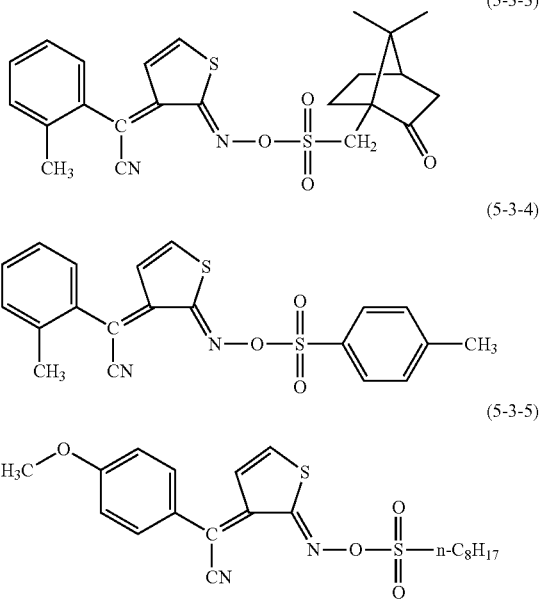

(5-3-3)

(5-3-4)

(5-3-5)

In the Formula (5-1), the Formula (5-2) and the Formula (5-3), $R^{11}$ are each independently defined in the same manner as in the Formula (5). In the Formula (5-1), the Formula (5-2) and the Formula (5-3), $R^{15}$ are each independently a C1-12 alkyl group or a C1-12 fluoroalkyl group.

In Formula (5-3), X is an alkyl group, an alkoxy group or a halogen atom; m is an integer of from 0 to 3; if a plurality of X's is present, X's may be the same or different from one another.

In the Formula (5-3), the alkyl group shown by X is preferably a C1-4 linear or branched alkyl group; the alkoxy group shown by X is preferably a C1-4 linear or branched alkoxy group; the halogen atom shown by X is preferably a chlorine atom or a fluorine atom; and m is preferably 0 or 1. Compounds particularly preferred in the Formula (5-3) are those in which m is 1, X is a methyl group, and the position of the substitution of X is ortho position.

Examples of the oximesulfonate compounds represented by the (5-3) include compounds represented by Formulae (5-3-1) to (5-3-5).

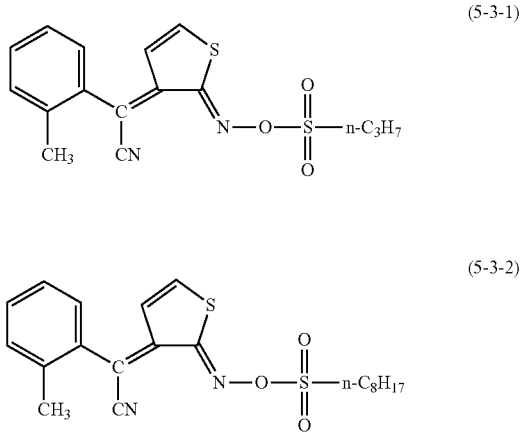

(5-3-1)

(5-3-2)

The compounds represented by the Formula (5-3-1) to the Formula (5-3-5) are 5-propylsulfonyloxyimino-5H-thiophene-2-ylidene)-(2-methylphenyl)acetonitrile, (5-octylsulfonyloxyimino-5H-thiophene-2-ylidene)-(2-methylphenyl) acetonitrile, (camphorsulfonyloxyimino-5H-thiophene-2-ylidene)-(2-methylphenyl)acetonitrile, (5-p-toluenesulfonyloxyimino-5H-thiophene-2-ylidene)-(2-methylphenyl)acetonitrile, and (5-octylsulfonyloxyimino)-(4-methoxyphenyl)acetonitrile, respectively, which are commercially available.

[Onium Salts]

Examples of the onium salts include diphenyliodonium salts, triphenylsulfonium salts, alkylsulfonium salts, benzylsulfonium salts, dibenzylsulfonium salts, substituted benzyl sulfonium salts, benzothiazonium salts, and tetrahydrothiophenium salts. Particularly preferred among these are triphenylsulfonium salts.

Examples of the triphenylsulfonium salts include triphenylsulfonium trifluoromethane sulfonate, triphenylsulfonium camphorsulfonic acid, triphenylsulfonium tetrafluoroborate, triphenylsulfonium trifluoroacetate, triphenylsulfonium-p-toluenesulfonate, and triphenylsulfonium butyltris(2,6-difluorophenyl)borate.

[Sulfonimide Compounds]

Examples of the sulfonimide compounds preferred as the acid generator [C] include N-(trifluoromethylsulfonyloxy) succinimide, N-(camphorsulfonyloxy)succinimide, N-(4-methylphenylsulfonyloxy)succinimide, N-(2-trifluoromethylphenylsulfonyloxy)succinimide, N-(4-fluorophenylsulfonyloxy)succinimide, N-(trifluoromethylsulfonyloxy)phthalimide, N-(camphorsulfonyloxy)phthalimide, N-(2-trifluoromethylphenylsulfonyloxy)phthalimide, N-(2-fluorophenylsulfonyloxy)phthalimide, N-(trifluoromethylsulfonyloxy)diphenylmaleimide, and N-(camphorsulfonyloxy)diphenylmaleimide.

The acid generators [C] are preferably oximesulfonate compounds, onium salts, and sulfonic acid ester compounds; and more preferably oximesulfonate compounds. More preferred as the oximesulfonate compounds are the oximesulfonate group-containing compounds represented by the Formulae (5-3-1) to (5-3-5); and more preferably the compounds represented by the Formula (5-3-5).

The onium salts are preferably tetrahydrothiophenium salt and benzylsulfonium salt; more preferably 4,7-di-n-butoxy-1-naphthyltetrahydrothiophenium trifluoromethane sulfonate, benzyl-4-hydroxyphenylmethylsulfoniumhexafluorophosphate; and much more preferably 4,7-di-n-butoxy-1-naphthyltetrahydrothiophenium trifluoromethane sulfonate. The sulfonic acid ester compounds are preferably haloalkyl sulfonic acid esters, and more preferably N-hydroxynaphthalimide-trifluoromethane sulfonic acid ester. By the acid generators [C] being the above-described compounds, the radiation-sensitive composition according to the embodiments of the present invention can have enhanced sensitivity and much more improved solubility.

The content of the acid generator [C] with respect to 100 parts by mass of the compound [A] is preferably 0.1 to 10 parts by mass, and more preferably 1 to 5 parts by mass. Controlling the content of the acid generator [C] so as to be in the above range can optimize the sensitivity of the radiation-sensitive composition, and thus performing the steps (i) to (v) can form a concave pattern with a higher resolution.

<Sensitizer [D]>

The radiation-sensitive composition may contain a sensitizer [D].

Examples of the sensitizer [D] are those belonging to compounds listed below and having absorption wavelength in the region of from 350 nm to 450 nm.

The sensitizers [D] are preferably polynuclear aromatics, acridones, styryls, base styryls, coumarins, and xanthones, and are more preferably xanthones. Among xanthones, diethylthioxanthone and isopropylthioxanthone are particularly preferable.

The sensitizers [D] may be used singly, or two or more kinds thereof may be used. The content of the sensitizer [D] with respect to 100 parts by mass of the compound [A] is preferably 0.1 to 8 parts by mass, and more preferably 1 to 4 parts by mass. Controlling the content of the sensitizer [D] so as to be in the above range can optimize the sensitivity of the radiation-sensitive composition, and thus performing the steps (i) to (v) can form a concave pattern with a high resolution.

<Quencher [E]>

The radiation-sensitive composition may contain a quencher [E].

The quencher [E] functions as an agent for inhibiting acid diffusion that inhibits the diffusion of an acid from the acid generator [C]. The quencher [E] captures an acid from the acid generator [C], and deactivates the acid being diffused from the exposed region toward the unexposed region. Thus, the deactivation of the acid only at the unexposed region improves the contrast of the reaction of the elimination of the protecting group, consequently more enhancing the resolution. Examples of the quencher [E] include aliphatic amines, aromatic amines, heterocyclic amines, quaternary ammonium hydroxide, carboxylic acid quaternary ammonium salts, and onium salts. More specific examples are triethylamine, pyridine, dodecylamine, triphenylsulfonium salicylic acid, and triphenylsulfonium camphorsulfonic acid.

The quenchers [E] may be used singly, or two or more kinds thereof may be used.

The content of the quencher [E] with respect to 100 parts by mass of the compound [A] is preferably 0.001 to 5 parts by mass, and more preferably 0.005 to 3 parts by mass. Controlling the content of the quencher [E] so as to be in the above range can optimize the reactivity of the radiation-sensitive composition, and thus performing the steps (i) to (v) can forma a concave pattern with a higher resolution.

<Polymerizable Compound [F]>

Allowing the radiation-sensitive composition to contain a polymerizable compound [F] enables the composition to be cured.

The polymerizable compound [F] is a polymerizable compound having an ethylenic unsaturated bond, and is a compound differing from the compound [A].

The polymerizable compounds [F] are preferably monofunctional, bifunctional or tri- or higher functional (meth) acrylic acid esters from the viewpoint that those compounds have good polymerizability and allow the radiation-sensitive composition to provide films with increased strength.

The monofunctional compounds refer to compounds having one (meth)acryloyl group, and the bifunctional and tri- or higher functional compounds refer to, respectively, compounds having two (meth)acryloyl groups and compounds having three or more (meth)acryloyl groups.

The polymerizable compounds [F] are preferably, for example, commercially-available products including any of ω-carboxypolycaprolactone monoacrylate, 1,9-nonanediol dimethacrylate, trimethylolpropane triacrylate, pentaerythritol triacrylate, pentaerythritol tetraacrylate, dipentaerythritol pentaacrylate, dipentaerythritol hexaacrylate, a mixture of dipentaerythritol hexaacrylate and dipentaerythritol pentaacrylate, ethylene oxide-modified dipentaerythritol hexaacrylate, succinic acid-modified pentaerythritol triacrylate, succinic acid-modified dipentaerythritol pentaacrylate, and multifunctional urethane acrylate compound. Among those, tri- or higher functional (meth)acrylic acid esters are preferable, and the mixture of dipentaerythritol hexaacrylate and dipentaerythritol pentaacrylate is particularly preferred.

The polymerizable compounds [F] may be used singly, or two or more kinds thereof may be used. The amount of the polymerizable compound [F] used with respect to 100 parts by mass of the compound [A] is preferably 1 to 300 parts by mass, more preferably 3 to 200 parts by mass, and much more preferably 5 to 100 parts by mass. Controlling the amount of the polymerizable compound [F] used in the above range allows the radiation-sensitive composition to provide coating films with increased hardness and more improved heat resistance.

<Radiation-Sensitive Polymerization Initiator [G]>

The radiation-sensitive polymerization initiator [G] is a compound which by being irradiated with radiation promotes the polymerization of the polymerizable compound [F]. Thus, the radiation-sensitive composition containing the polymerizable compound [F] preferably contains the radiation-sensitive polymerization initiator [G].

Examples of the radiation-sensitive polymerization initiator [G] include O-acyloxime compounds, acetophenone compounds and biimidazole compounds.

Preferred examples of the O-acyloxime compounds include ethanone-1-[9-ethyl-6-(2-methylbenzoyl)-9H-carbazole-3-yl]-1-(O-acetyloxime), ethanone-1-[9-ethyl-6-(2-methyl-4-tetrahydrofuranylmethoxybenzoyl)-9.H.-carbazole-3-yl]-1-(O-acetyloxime), and ethanone-1-[9-ethyl-6-{2-methyl-4-(2,2-dimethyl-1,3-dioxolanyl) methoxybenzoyl}-9.H.-carbazole-3-yl]-1-(O-acetyloxime).

The acetophenone compounds are preferably α-aminoketone compounds, and particularly preferably 2-dimethylamino-2-(4-methylbenzyl)-1-(4-morpholine-4-yl-phenyl)-butane-1-one, and 2-methyl-1-(4-methylthiophenyl)-2-morpholinopropane-1-one.

The biimidazole compounds are preferably 2,2'-bis(2-chlorophenyl)-4,4',5,5'-tetraphenyl-1,2'-biimidazo le, 2,2'- bis(2,4-dichlorophenyl)-4,4',5,5'-tetraphenyl-1,2'-biimidazole, and 2,2'-bis(2,4,6-trichlorophenyl)-4,4',5,5'-tetraphenyl-1,2'-biimidazole; and particularly preferred is 2,2'-bis(2,4-dichlorophenyl)-4,4',5,5'-tetraphenyl-1,2'-biimidazole.

In the radiation-sensitive composition, incases where the radiation-sensitive polymerization initiator [G] is a biimidazole compound, the compound may be sensitized by adding an aliphatic or aromatic compound having a dialkylamino group (hereinafter also referred to as the "amino-based sensitizer").

Incases where the biimidazole compound and the amino-based sensitizer are used in combination, a thiol compound can be added as a hydrogen radical-imparting agent.

The radiation-sensitive composition, when containing the radiation-sensitive polymerization initiator [G], preferably contains at least one kind selected from the group consisting of O-acyloxime compounds and acetophenone compounds, and may further contain a biimidazole compound.

The radiation-sensitive polymerization initiators [G] may be used singly, or two or more kinds thereof may be used.

The amount of the radiation-sensitive polymerization initiator [G] used with respect to 100 parts by mass of the compound [A] is preferably 0.05 to 50 parts by mass, and more preferably 0.1 to 20 parts by mass. By controlling the amount of the radiation-sensitive polymerization initiator [G] used so as to be in the above range, the radiation-sensitive composition, even when irradiated at low exposure quantity, can be highly sensitive to radiation for the curing of the coating film.

<Other Optional Components>

The radiation-sensitive composition may further contain other optional components as long as the effects of the present invention are not impaired.

Examples of such other optional components include surfactants, storage stabilizers, bonding assistants, and heat resistance-improving agents.

Such other optional components may be used singly, or two or more kinds thereof may be used.

[Wiring-Forming Material]

The wiring-forming material is not particularly limited and can be any material capable of forming wiring, and is preferably a liquid ink or paste with fluidity.

Examples thereof include conductive film-forming ink, conductive film-forming paste, resin film-formable resin solution ink and resin solution paste, coloring ink or coloring paste containing a pigment or a dye, organic semiconductor solution, oxide semiconductor dispersion, organic EL luminous solution, and ink containing quantum dot or nanocarbon such as carbon nanotube, graphene or carbon black.

Of these, conductive film-forming ink and conductive film-forming paste are preferred. Specifically preferred are ink or paste in which metal particles are dispersed, ink or paste containing a metal salt and a reducing agent, ink or paste in which metal oxide particles capable of being metallized by heating under a reducing atmosphere are dispersed, conductive polymer dispersion or solution, and ink or paste in which nanocarbon such as carbon nanotube or graphene is dispersed. Particularly in terms of conductivity and coatability, ink or paste in which metal particles are dispersed, and ink or paste containing a metal salt and a reducing agent are preferred.

It is possible to form a coating film with those ink or paste by various printing methods and coating methods. The coating film, by being heated, becomes a film with conductivity (wiring).

The ink and paste that are desired are materials having a viscosity (temperature: 20° C., shear rate: 10 sec$^{-1}$) which is preferably 0.001 to 100 Pa·s, and more preferably 0.001 to 1 Pa·s.

In the application of the wiring-forming material in the step (iv) by such a method as offset printing and screen printing, materials with a high viscosity range are suited. The viscosity of the material at this time is preferably 1 Pa·s to 50 Pa·s. Particularly in the case of offset printing, the material preferably has a viscosity of 10 Pa·s to 50 Pa·s.

In the formation of wiring, it has been demanded from viewpoints such as coatability, handleability and storage easiness to use wiring-forming materials having a low viscosity from 0.001 to 100 Pa·s, preferably 0.001 to 1 Pa·s (temperature: 20° C., shear rate: 10 sec$^{-1}$). With the use of such materials having low viscosity, however, conventional wiring production processes have been unsuccessful in producing high-definition wiring from viewpoints such as the occurrence of the wet-spreading and the bleeding of the wiring-forming materials.

In the embodiments of the present invention, on the other hand, since wiring is formed on the concave region obtained in the step (iii), even the use of the wiring-forming material having a low viscosity inhibits the material from the wet-spreading and bleeding, leading to the production of a high-definition wiring.

Thus, from the viewpoint of allowing the effects of the present invention to be more exhibited, it is preferred to use the wiring-forming material having a low viscosity.

EXAMPLES

The present invention will be described hereinafter with greater detail with reference to Examples, but the present invention is in no way construed by being limited to the Examples.

[GPC Analysis]

A weight average molecular weight (Mw) and a molecular weight distribution (Mw/Mn) as measured by gel permeation chromatography of the resultant polymer [A.] were measured under conditions described below.

Measurement method: gel permeation chromatography (GPC)

Standard substance: polystyrene

Apparatus: product name: HLC-8220, manufactured by Tosoh Corporation

Columns: guard column $H_{XL}$-H, TSK gel G7000$H_{XL}$, TSK gel GMH$_{XL}$ two columns, TSK gel G2000$H_{XL}$, manufactured by Tosoh Corporation, that are sequentially connected Solvent: tetrahydrofuran Sample concentration: 0.7% by mass Injection volume: 70 μL Flow rate: 1 mL/min

[Measurement of $^1$H-NMR]

$^1$H-NMR was measured in a CDCl$_3$ solvent with a nuclear magnetic resonance apparatus (AVANCEIII AV400N manufactured by Bruker), under a temperature of 25° C.

Synthesis of Polymer [A]

Synthesis Example 1

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of diethylene glycol dimethyl ether. Subsequently, the flask was charged with 42 parts by mass of 2-hydroxyethyl methacrylate and 58 parts by mass of benzyl methacrylate. Under nitrogen atmosphere, the temperature of the solution was elevated to 80° C. with gentle stirring. With this temperature kept for 4 hours, polymerization was performed. As a result, a solution containing a polymer (A-1), which was a copolymer, was obtained (solid content concentration=34.6% by mass, Mw=26000, Mw/Mn=2.2). The solid content concentration refers to a proportion of the mass of the copolymer in the total mass of the copolymer solution.

Subsequently, to 10 parts by mass of the resultant solution containing the polymer (A-1), 13 parts by mass of diethylene glycol dimethyl ether and 4.8 parts by mass of 3,3,4,4,5,5,6,6,7,7,8,8,8-tridecafluoro-1-vinyloxyoctane were added, which was followed by sufficient stirring. Thereafter, 0.27 parts by mass of trifluoroacetic acid was added. Under nitrogen atmosphere, the reaction was allowed to proceed at 80° C. for 9 hours. Thereafter, the reaction solution was cooled to room temperature. This was followed by adding 0.3 parts by mass of pyridine to quench the reaction. The resultant reaction solution was dropwise added to an excess amount of methanol for reprecipitation purification. Thereafter, the precipitate was dissolved in 10 parts by mass of diethylene glycol dimethyl ether, and the solution was dropwise added to an excess amount of hexane for reprecipitation purification. Through drying, a polymer [A] (P-1), which was a white solid copolymer, was obtained in an amount of 6.8 parts by mass. Analysis of the resultant polymer [A] (P-1) with $^1$H-NMR found that acetalization had progressed (chemical shift: 4.80 ppm, acetal group C—H).

Synthesis Example 2

A flask equipped with a condenser and a stirrer was charged with 8 parts by mass of dimethyl-2,2'-azobis(2-methylpropionate), 2 parts by mass of pentaerythritoltetrakis(3-mercaptopropionate), and 200 parts by mass of propylene glycol monomethyl ether. Subsequently, the flask was charged with 75 parts by mass of 2-hydroxyethyl methacrylate and 25 parts by mass of benzyl methacrylate. After purging with nitrogen, the temperature of the solution was elevated to 80° C. with gentle stirring. With this temperature kept for 4 hours, polymerization was performed. As a result, a solution containing a polymer (A-2), which was a copolymer, was obtained. The resultant solution was dropwise added to an excess amount of hexane. Through drying, a white solid polymer (A-2) was obtained (Mw=28000, Mw/Mn=2.3).

Subsequently, 5 parts by mass of the polymer (A-2) was dissolved in 42 parts by mass of tetrahydrofuran. Thereto, 12.4 parts by mass of 3,3,4,4,5,5,6,6,7,7,8,8,8-tridecafluoro-1-vinyloxyoctane was added. After sufficient stirring, 0.66 parts by mass of trifluoroacetic acid was added. Under nitrogen atmosphere, the reaction was allowed to proceed at 80° C. for 9 hours. Thereafter, the reaction solution was cooled to room temperature. This was followed by adding 0.7 parts by mass of pyridine to quench the reaction. The resultant reaction solution was dropwise added to an excess amount of methanol for reprecipitation purification. Thereafter, the precipitate was dissolved again in 15 parts by mass of diethylene glycol dimethyl ether, and the solution was dropwise added to hexane for reprecipitation purification. As a result, a polymer [A] (P-2), which was a white solid copolymer, was obtained in an amount of 11.0 parts by mass. Analysis of the resultant polymer [A] (P-2) with $^1$H-NMR found that acetalization had progressed (chemical shift: 4.80 ppm, acetal group C—H).

Synthesis Example 3

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of propylene glycol monomethyl ether. Subsequently, the flask was charged with 30 parts by mass of methacrylic acid and 70 parts by mass of benzyl methacrylate. After purging with nitrogen, the temperature of the solution was elevated to 80° C. with gentle stirring. With this temperature kept for 4 hours, polymerization was performed. As a result, a solution containing a polymer (A-3) which was a copolymer was obtained. The resultant solution was dropwise added to an excess amount of hexane. Through drying, a white solid polymer (A-3) was obtained (Mw=24000, Mw/Mn=2.2).

Subsequently, 5 parts by mass of the polymer (A-3) was dissolved in 34 parts by mass of diethylene glycol dimethyl ether. Thereto, 9.4 parts by mass of 3,3,4,4,5,5,6,6,7,7,8,8,9,9,10,10,10-heptadecafluoro-1-vinyloxydecane was added. After sufficient stirring, 0.09 parts by mass of pyridinium paratoluenesulfonate was added. Under nitrogen atmosphere, the reaction was allowed to proceed at 80° C. for 5 hours. Thereafter, the reaction solution was cooled to room temperature. This was followed by adding 0.04 parts by mass of pyridine to quench the reaction. The resultant reaction solution was dropwise added to an excess amount of methanol for reprecipitation purification. Thereafter, the precipitate was dissolved again in 15 parts by mass of diethylene glycol dimethyl ether, and the solution was dropwise added to hexane for reprecipitation purification. As a result, a polymer [A] (P-3), which was a white solid copolymer, was obtained in an amount of 10.9 parts by mass. Analysis of the resultant polymer [A] (P-3) with $^1$H-NMR found that acetalization had progressed (chemical shift: 5.74 ppm, acetal group C—H).

Synthesis Example 4

A flask equipped with a condenser and a stirrer was charged with 8 parts by mass of dimethyl-2, 2'-azobis(2-methylpropionate), 2 parts by mass of 2,4-diphenyl-4-methyl-1-pentene, and 200 parts by mass of propylene glycol monomethyl ether. Subsequently, the flask was charged with 60 parts by mass of 2-methacryloyloxyethyl-succinic acid and 40 parts by mass of benzyl methacrylate. After purging with nitrogen, the temperature of the solution was elevated to 80° C. with gentle stirring. With this temperature kept for 4 hours, polymerization was performed. As a result, a solution containing a polymer (A-4), which was a copolymer, was obtained. The resultant solution was dropwise added to an excess amount of hexane. Through drying, a white solid polymer (A-4) was obtained (Mw=23400, Mw/Mn=2.2).

Subsequently, 5 parts by the mass of the polymer (A-4) was dissolved in 20 parts by mass of tetrahydrofuran. Thereto, 3.5 parts by mass of 3,3,4,4,5,5,6,6,6-nonafluoro-1-vinyloxyhexane was added. After sufficient stirring, 0.06 parts by mass of pyridinium paratoluenesulfonate was added. Under nitrogen atmosphere, the reaction was allowed to proceed at 60° C. for 5 hours. Thereafter, the reaction solution was cooled to room temperature. This was followed by adding 0.03 parts by mass of pyridine to quench the reaction. The resultant reaction solution was dropwise added to an excess amount of methanol for reprecipitation purification. Thereafter, the precipitate was dissolved again in 15 parts by mass of tetrahydrofuran, and the solution was dropwise added to hexane for reprecipitation purification. As a result, a polymer [A] (P-4), which was a white solid copolymer, was obtained in an amount of 6.0 parts by mass. Analysis of the resultant polymer [A] (P-4) with $^1$H-NMR found that acetalization had progressed (chemical shift: 5.74 ppm, acetal group C—H).

Synthesis Example 5

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of diethylene glycol dimethyl ether. Subsequently, the flask was charged with 50 parts by mass of hydroxyphenyl methacrylate and 50 parts by mass of benzyl methacrylate. After purging with nitrogen, the temperature of the solution was elevated to 80° C. with gentle stirring. With this temperature kept for 4 hours, polymerization was performed. As a result, a solution containing a polymer (A-5), which was a copolymer, was obtained (solid content concentration=34.5% by mass, Mw=22000, Mw/Mn=2.1).

Subsequently, to 10 parts by mass of the resultant solution containing the polymer (A-5), 10.3 parts by mass of diethylene glycol dimethyl ether and 3.6 parts by mass of perfluorocyclohexyl methyl vinyl ether were added, which was followed by sufficient stirring. Thereafter, 0.17 parts by mass of trifluoroacetic acid was added. Under nitrogen atmosphere, the reaction was allowed to proceed at 80° C. for 9 hours. Thereafter, the reaction solution was cooled to room temperature. This was followed by adding 0.17 parts by mass of pyridine to quench the reaction. The resultant reaction solution was dropwise added to an excess amount of methanol for reprecipitation purification. Thereafter, the precipitate was dissolved again in 15 parts by mass of diethylene glycol dimethyl ether, and the solution was dropwise added to hexane for reprecipitation purification. As a result, a polymer [A] (P-5), which was a white solid copolymer, was obtained in an amount of 5.3 parts by mass. Analysis of the resultant polymer [A] (P-5) with $^1$H-NMR found that acetalization had progressed (chemical shift: 5.50 ppm, acetal group C—H).

Synthesis Example 6

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of diethylene glycol dimethyl ether. Subsequently, the flask was charged with 40 parts by mass of p-isopropenylphenol, 50 parts by mass of cyclohexylmaleimide and 10 parts by mass of benzyl methacrylate. After purging with nitrogen, the temperature of the solution was elevated to 80° C. with gentle stirring. With this temperature kept for 4 hours, polymerization was performed. As a result, a solution containing a polymer (A-6), which was a copolymer, was obtained (solid content concentration=34.9% by mass, Mw=24000, Mw/Mn=2.1).

Subsequently, to 10 parts by mass of the resultant solution containing the polymer (A-6), 7.5 parts by mass of diethylene glycol dimethyl ether and 2.4 parts by mass of perfluorophenyl vinyl ether were added, which was followed by sufficient stirring. Thereafter, 0.2 parts by mass of trifluoroacetic acid was added. Under nitrogen atmosphere, the reaction was allowed to proceed at 80° C. for 9 hours. Thereafter, the reaction solution was cooled to room temperature. This was followed by adding 0.2 parts by mass of pyridine to quench the reaction. The resultant reaction solution was dropwise added to an excess amount of methanol for reprecipitation purification. Thereafter, the precipitate was dissolved again in 20 parts by mass of diethylene glycol dimethyl ether, and the solution was dropwise added to hexane for reprecipitation purification. The polymer [A] (P-6), which was a pale-yellowish white solid copolymer, was obtained in an amount of 4.7 parts by mass. Analysis of the resultant polymer [A] (P-6) with $^1$H-NMR found that acetalization had progressed (chemical shift: 5.50 ppm, acetal group C—H).

Synthesis Example 7

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of propylene glycol monomethyl ether. Subsequently, the flask was charged with 45 parts by mass of glycerin monomethacrylate and 55 parts by mass of benzyl methacrylate. After purging with nitrogen, the temperature of the solution was elevated to 80° C. with gentle stirring. With this temperature kept for 4 hours, polymerization was performed. As a result, a solution containing a polymer (A-7), which was a copolymer, was obtained. The resultant solution was dropwise added to an excess amount of hexane. Through drying, a white solid polymer (A-7) was obtained (Mw=21400, Mw/Mn=2.3).

Subsequently, 5 parts by mass of the polymer (A-7) was dissolved in 38 parts by mass of tetrahydrofuran. Thereto, 11 parts by mass of 3,3,4,4,5,5,6,6,7,7,8,8,8-tridecafluoro-1-vinyloxyoctane was added. After sufficient stirring, 0.32 parts by mass of trifluoroacetic acid was added. Under nitrogen atmosphere, the reaction was allowed to proceed at 60° C. for 9 hours. Thereafter, the reaction solution was cooled to room temperature. This was followed by adding 0.3 parts by mass of pyridine to quench the reaction. The resultant reaction solution was dropwise added to an excess amount of methanol for reprecipitation purification. Thereafter, the precipitate was dissolved again in 20 parts by mass of tetrahydrofuran, and the solution was dropwise added to hexane for reprecipitation purification. As a result, a polymer [A] (P-7), which was a white solid copolymer, was obtained in an amount of 9.8 parts by mass. Analysis of the resultant polymer [A] (P-7) with $^1$H-NMR found that acetalization had progressed (chemical shift: 4.81 ppm, acetal group C—H).

Synthesis Example 8

A flask equipped with a condenser and a stirrer was charged with 5 parts by mass of the polymer (A-2) obtained above, which was dissolved with 31 parts by mass of tetrahydrofuran. Thereto, 6.7 parts by mass of 3,3,4,4,5,5,6,6,7,7,8,8,8-tridecafluoro-1-vinyloxyoctane and 0.7 parts by mass of 1-vinyloxybutane were added. After sufficient stirring, 0.66 parts by mass of trifluoroacetic acid was added. Under nitrogen atmosphere, the reaction was allowed to proceed at 60° C. for 9 hours. Thereafter, the reaction solution was cooled to room temperature. This was followed by adding 0.7 parts by mass of pyridine to quench the reaction. The resultant reaction solution was dropwise added to an excess amount of methanol for reprecipitation purification. Thereafter, the precipitate was dissolved again in 25 parts by mass of tetrahydrofuran, and the solution was dropwise added to hexane for reprecipitation purification. As a result, a polymer [A] (P-8), which was a white solid copolymer, was obtained in an amount of 8.4 parts by mass. Analysis of the resultant polymer [A] (P-8) with $^1$H-NMR found that acetalization had progressed (chemical shift: 4.80 ppm, acetal group C—H).

Synthesis Example 9

A flask equipped with a condenser and a stirrer was charged with 5 parts by mass of polyvinyl phenol (MARUKA LYNCUR S-4P Maruzen Petrochemical Co., Ltd.), which was dissolved with 50 parts by mass of tetrahydrofuran. Thereto, 16 parts by mass of 3,3,4,4,5,5,6,6,7,7,8,8,8-tridecafluoro-1-vinyloxyoctane was added. After sufficient stirring, 0.50 parts by mass of trifluoroacetic acid was added. Under nitrogen atmosphere, the reaction was allowed to proceed at 60° C. for 9 hours. Thereafter, the reaction solution was cooled to room temperature. This was followed by adding 0.5 parts by mass of pyridine to quench the reaction. The resultant reaction solution was dropwise added to an excess amount of methanol for reprecipitation purification. Thereafter, the precipitate was dissolved again in 30 parts by mass of tetrahydrofuran, and the solution was dropwise added to hexane for reprecipitation purification. As a result, a polymer [A] (P-9), which was a white solid copolymer, was obtained. Analysis of the resultant polymer [A] (P-9) with $^1$H-NMR found that acetalization had progressed (chemical shift: 5.48 ppm, acetal group C—H).

Synthesis Example 10

A flask equipped with a condenser and a stirrer was charged with 5 parts by mass of a phenol novolak resin represented by formula below, P-200, (manufactured by Arakawa Chemical Industries, Ltd.), which was dissolved with 60 parts by mass of tetrahydrofuran. Thereto, 20 parts by mass of 3,3,4,4,5,5,6,6,7,7,8,8,9,9,10,10,10-heptadecafluoro-1-vinyloxydecane was added. After sufficient stirring, 0.50 parts by mass of trifluoroacetic acid was added. Under nitrogen atmosphere, the reaction was allowed to proceed at 60° C. for 9 hours. Thereafter, the reaction solution was cooled to room temperature. This was followed by adding 0.5 parts by mass of pyridine to quench the reaction. The resultant reaction solution was dropwise added to an excess amount of methanol for reprecipitation purification. Thereafter, the resultant solution was dissolved again in 30 parts by mass of tetrahydrofuran, and the solution was dropwise added to hexane for reprecipitation purification. As a result, a polymer [A] (P-10), which was a white solid copolymer, was obtained in an amount of 12.1 parts by mass. Analysis of the resultant polymer [A] (P-10) with $^1$H-NMR found that acetalization had progressed (chemical shift: 5.49 ppm, acetal group C—H).

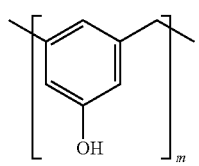

P-200

Synthesis Example 11

A flask equipped with a condenser and a stirrer was charged with 25 parts by mass of 2-hydroxyethyl methacrylate, 101 parts by mass of 3,3,4,4,5,5,6,6,7,7,8,8,8-tridecafluoro-1-vinyloxy-octane, 2.0 parts by mass of trifluoroacetic acid (TFA) and 200 parts by mass of tetrahydrofuran (THF). Under nitrogen atmosphere, the reaction was allowed to proceed at 60° C. for 9 hours. After cooling, to the reaction liquid, 2.1 parts by mass of pyridine was added to quench the reaction. The resultant reaction liquid was washed with water and separated. The solvent was removed with a rotary evaporator. Unreacted components were removed by distillation under reduced pressure. As a result, an acetalized product (M-1) was obtained.

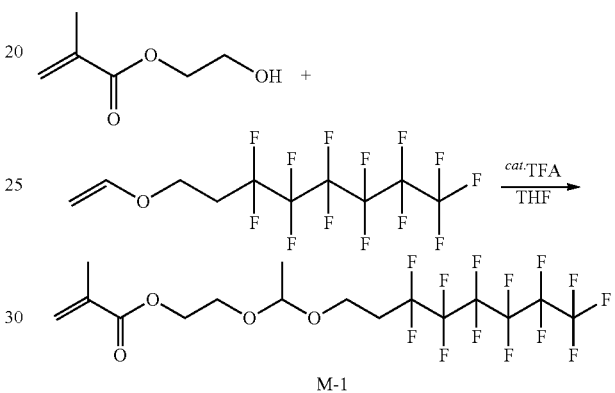

M-1

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of diethylene glycol dimethyl ether. Subsequently, the flask was charged with 70 parts by mass of the acetalized product (M-1) obtained above and 30 parts by mass of benzyl methacrylate. After purging with nitrogen, the temperature of the solution was elevated to 80° C. with gentle stirring. With this temperature kept for 4 hours, polymerization was performed. As a result, a solution containing a polymer [A] (P-11), which was a copolymer, was obtained (Mw=23100, Mw/Mn=2.3, $^1$H-NMR chemical shift: 4.80 ppm, acetal group C—H).

Synthesis Example 12

A flask equipped with a condenser and a stirrer was charged with 25 parts by mass of 2-methacryloyloxyethyl-succinic acid, 53 parts by mass of 3,3,4,4,5,5,6,6,7,7,8,8,8-tridecafluoro-1-vinyloxy-octane, 1.1 parts by mass of pyridinium paratoluenesulfonate (PPTSA) and 200 parts by mass of tetrahydrofuran (THF). Under nitrogen atmosphere, the reaction was allowed to proceed at 60° C. for 9 hours. After cooling, to the reaction liquid, 0.5 parts by mass of pyridine was added to quench the reaction. The resultant reaction liquid was washed with water and separated. The solvent was removed with a rotary evaporator. Unreacted components were removed by distillation under reduced pressure. As a result, an acetalized product (M-2) was obtained.

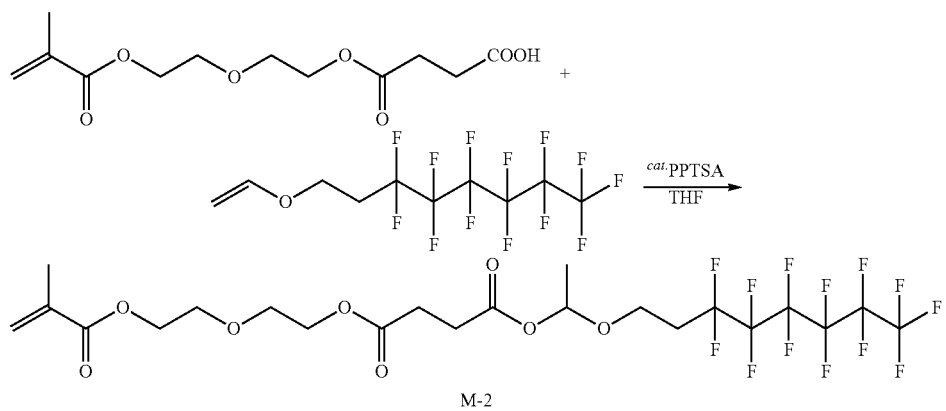

M-2

A flask equipped with a condenser and a stirrer was charged with 8 parts by mass of dimethyl-2, 2'-azobis(2-methylpropionate), 2 parts by mass of 2,4-diphenyl-4-methyl-1-pentene, and 200 parts by mass of diethylene glycol dimethyl ether. Subsequently, the flask was charged with 75 parts by mass of the acetalized product (M-2) obtained above and 25 parts by mass of benzyl methacrylate. After purging with nitrogen, the temperature of the solution was elevated to 80° C. with gentle stirring. With this temperature kept for 4 hours, polymerization was performed. As a result, a solution containing a polymer [A] (P-12), which was a copolymer, was obtained (Mw=24100, Mw/Mn=2.3, $^1$H-NMR chemical shift: 4.80 ppm, acetal group C—H).

Synthesis Example 13

A flask equipped with a condenser and a stirrer was charged with 25 parts by mass of hydroxyphenyl methacrylate, 82 parts by mass of 3,3,4,4,5,5,6,6,7,7,8,8,8-tridecafluoro-1-vinyloxy-octane, 1.6 parts by mass of trifluoroacetic acid (TFA) and 200 parts by mass of tetrahydrofuran (THF). Under nitrogen atmosphere, the reaction was allowed to proceed at 60° C. for 9 hours. After cooling, to the reaction liquid, 1.7 parts by mass of pyridine was added to quench the reaction. The resultant reaction liquid was washed with water and separated. The solvent was removed with a rotary evaporator. Unreacted components were removed by distillation under reduced pressure. As a result, an acetalized product (M-3) was obtained.

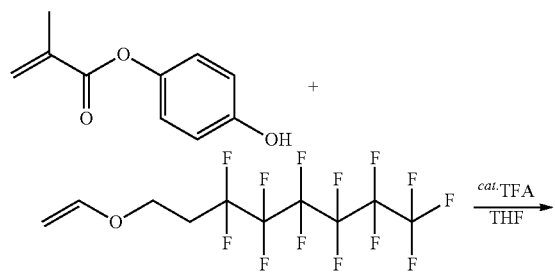

-continued

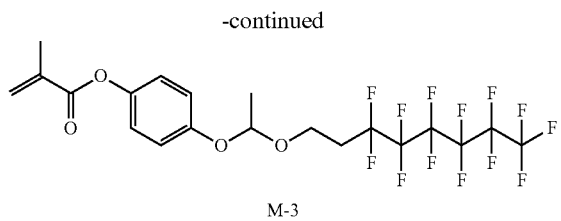

M-3

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of diethylene glycol dimethyl ether. Subsequently, the flask was charged with 75 parts by mass of the acetalized product (M-3) obtained above and 25 parts by mass of benzyl methacrylate. After purging with nitrogen, the temperature of the solution was elevated to 80° C. with gentle stirring. With this temperature kept for 4 hours, polymerization was performed. As a result, a solution containing a polymer [A] (P-13), which was a copolymer, was obtained (Mw=21800, Mw/Mn=2.2, $^1$H-NMR chemical shift: 5.50 ppm, acetal group C—H).

Synthesis Example 14

A flask equipped with a condenser and a stirrer was charged with 25 parts by mass of 2-(2-vinyloxyethoxy)ethyl methacrylate (VEEM, manufactured by Nippon Shokubai Co., Ltd.), 45 parts by mass of 3,3,4,4,5,5,6,6,7,7,8,8,8-tridecafluorooctanol, 1.6 parts by mass of pyridinium paratoluenesulfonate (PPTSA), and 200 parts by mass of tetrahydrofuran (THF). Under nitrogen atmosphere, the reaction was allowed to proceed at room temperature for 8 hours. After the completion of the reaction, to the reaction liquid, 0.7 parts by mass of pyridine was added to quench the reaction. The resultant reaction liquid was washed with water and separated. The solvent was removed with a rotary evaporator. Unreacted components were removed by distillation under reduced pressure. As a result, an acetalized product (M-4) was obtained.

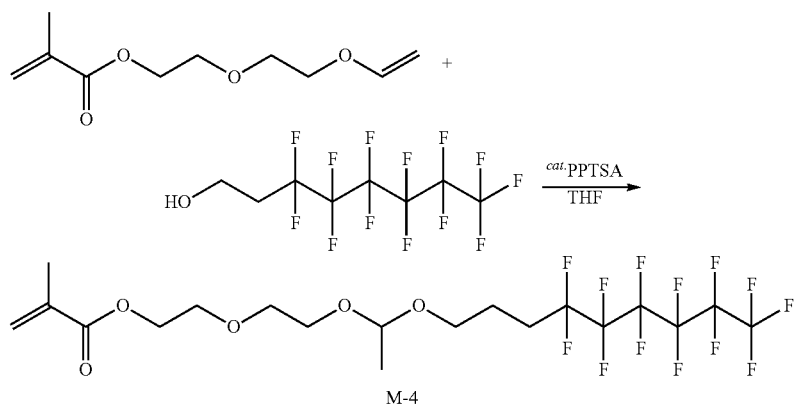

M-4

A flask equipped with a condenser and a stirrer was charged with 8 parts by mass of dimethyl-2,2'-azobis(2-methylpropionate), 2 parts by mass of 2,4-diphenyl-4-methyl-1-pentene, and 200 parts by mass of diethylene glycol dimethyl ether. Subsequently, the flask was charged with 75 parts by mass of the acetalized product (M-4) obtained above and 25 parts by mass of benzyl methacrylate. After purging with nitrogen, the temperature of the solution was elevated to 80° C. with gentle stirring. With this temperature kept for 4 hours, polymerization was performed. As a result, a solution containing a polymer [A] (P-14), which was a copolymer, was obtained (Mw=22700, Mw/Mn=2.1, chemical shift: 4.80 ppm, acetal group C—H).

<Preparation of Radiation-Sensitive Composition>

The components used in Examples will be described in detail below.

<Acid Generator [C]>
C-1: N-hydroxynaphthalimide-trifluoromethane sulfonic acid ester
C-2: 4,7-di-n-butoxy-1-naphthyltetrahydrothiophenium trifluoromethane sulfonate
C-3: CGI725 (manufactured by BASF)

<Sensitizer [D]>
D-1: 2-isopropylthioxanthone

<Quencher [E]>
E-1: 2-phenylbenzoimidazole
E-2: 4-(dimethylamino)pyridine

<Polymerizable Compound [F]>
F-1: dipentaerythritol hexaacrylate
F-2: 1,9-nonanediol diacrylate <Radiation-Sensitive Polymerization Initiator [G]>
G-1: 2-methyl-1-(4-methylthiophenyl)-2-morpholinopropane-1-one (IRGACURE (registered trademark) 907, manufactured by BASF)
G-2: 2-dimethylamino-2-(4-methylbenzyl)-1-(4-morpholine-4-yl-phenyl)-butane-1-one (IRGACURE (registered trademark) 379, manufactured by BASF)
G-3: ethanone-1-[9-ethyl-6-(2-methylbenzoyl)-9H-carbazole-3-yl]-1-(O-acetyloxime) (IRGACURE (registered trademark) OXE02, manufactured by BASF)

Examples 1 to 15

Components, the types and the contents of which are shown in Table 1, were mixed with one another. As a surfactant, 0.1 parts by mass of POLYFLOW No 75 (manufactured by KYOEISHA CHEMICAL CO., LTD.) was added. As the solvent [B], diethylene glycol dimethyl ether was added such that the solid content concentration was 20% by mass. Thereafter, the mixture was filtered with a Millipore Filter with a pore diameter of 0.5 μm. Thereby, radiation-sensitive compositions were prepared.

The mark "-" indicated in Table 1 means that a component indicated by the mark was not used.

Note that in Examples 11 to 15, it should not be understood that 100 parts by mass of the polymer [A] was used, and instead should be understood that a solution containing the polymer obtained in Synthesis Examples 11 to 14 was used such that solid contents (polymer) in the solution were 100 parts by mass.

TABLE 1

| | Compound [A] | | Acid generator [C] | | Sensitizer [D] | | Quencher [E] | | Polymerizable compound [F] | | Radiation-sensitive polymerization initiator [G] | |
|---|---|---|---|---|---|---|---|---|---|---|---|---|
| | Type | Content (parts by mass) | Type | Content (parts by mass) | Type | Content (parts by mass) | Type | Content (parts by mass) | Type | Content (parts by mass) | Type | Content (parts by mass) |
| Composition 1 | P-1 | 100 | C-1 | 2 | D-1 | 1 | E-1 | 0.05 | — | — | — | — |
| Composition 2 | P-2 | 100 | C-1 | 2 | — | — | E-1 | 0.05 | — | — | — | — |
| Composition 3 | P-3 | 100 | C-2 | 2 | — | — | E-1 | 0.05 | F-1 | 5 | G-1 | 2 |
| Composition 4 | P-4 | 100 | C-3 | 2 | — | — | E-1 | 0.05 | F-1 | 5 | G-1/G-2 | 2/1 |
| Composition 5 | P-5 | 100 | C-1 | 2 | D-1 | 1 | E-2 | 0.05 | F-2 | 5 | G-2/G-3 | 2/1 |
| Composition 6 | P-6 | 100 | C-1 | 2 | D-1 | 1 | E-2 | 0.05 | F-1/F-2 | 5/2 | G-1/G-3 | 2/1 |
| Composition 7 | P-7 | 100 | C-1 | 2 | D-1 | 1 | E-1 | 0.05 | — | — | — | — |
| Composition 8 | P-8 | 100 | C-2 | 2 | — | — | E-1 | 0.05 | — | — | — | — |

TABLE 1-continued

|  | Compound [A] | | Acid generator [C] | | Sensitizer [D] | | Quencher [E] | | Polymerizable compound [F] | | Radiation-sensitive polymerization initiator [G] | |
| --- | --- | --- | --- | --- | --- | --- | --- | --- | --- | --- | --- | --- |
|  | Type | Content (parts by mass) | Type | Content (parts by mass) | Type | Content (parts by mass) | Type | Content (parts by mass) | Type | Content (parts by mass) | Type | Content (parts by mass) |
| Composition 9 | P-9 | 100 | C-2 | 2 | — | — | E-1 | 0.05 | — | — | — | — |
| Composition 10 | P-10 | 100 | C-3 | 2 | — | — | E-1 | 0.05 | — | — | — | — |
| Composition 11 | P-11 | 100 | C-1 | 2 | D-1 | 1 | E-1 | 0.05 | F-1 | 5 | — | — |
| Composition 12 | P-12 | 100 | C-1 | 2 | D-1 | 1 | E-1 | 0.05 | F-1 | 5 | G-1 | 2 |
| Composition 13 | P-13 | 100 | C-1 | 2 | D-1 | 1 | E-1 | 0.05 | — | — | — | — |
| Composition 14 | P-14 | 100 | C-2 | 2 | — | — | E-1 | 0.05 | F-2 | 3 | G-2 | 2 |
| Composition 15 | A-1 | 100 | C-1 | 2 | D-1 | 1 | E-1 | 0.05 | F-1 | 5 | G-1 | 30 |

<Evaluation of Film>

The compositions 1 to 15 were used to form films, which were then evaluated in the following respects. Results thereof are shown in Table 2.

[Contact Angle]

On an alkali-free glass substrate, each of the compositions 1 to 15 was applied with a spinner, and prebaked on a hot plate at 90° C. for 2 minutes, to form a coating film with a thickness of 0.5 μm. Subsequently, the resultant coating film was irradiated with radiation via a quartz mask (contact) by using a high-pressure mercury lamp (exposure machine: MA-1400, manufactured by Japan Science Engineering Co., Ltd.), at an exposure quantity of 250 mJ/cm². Thereafter, the coating film was baked by using a hot plate at 110° C. for 5 minutes to give a film patterned with lyophilic regions and liquid-repellent regions (hereinafter, also called "lyophilic/liquid-repellent patterned film"), in which the exposed regions (concave regions) were the lyophilic regions and regions other than the exposed regions (convex regions) were the liquid-repellent regions. In the lyophilic/liquid-repellent patterned film formed, a contact angle gauge (CA-X, manufactured by Kyowa Interface Science Co., Ltd.) was used to measure contact angles of water, decane and tetradecane on the coating film surface of the exposed regions corresponding to the lyophilic regions and on the coating film surface of the unexposed regions corresponding to the liquid-repellent regions to study the lyophilic/liquid-repellent performance. In Table 2, the contact angle of water on the surface of the exposed regions is labeled by "lyophilic regions water", and the contact angle of water on the surface of the unexposed regions is labeled by "liquid-repellent regions water". The contact angles of decane and tetradecane are labeled similarly.

[Studying of Concave Patternability]

For a film obtained in the same manner as in [Contact angle], film thicknesses of exposed regions (lyophilic regions) and of unexposed regions (liquid-repellent regions) were measured with a contact-type film thickness meter (Alpha-Step IQ, manufactured by KEYENCE CORPORATION). A difference between the film thickness of the unexposed regions and the film thickness of the exposed regions was calculated, and a film thickness reduction percentage (%) to be determined from an equation below was calculated to study the formability of the concave shape.

Film thickness reduction percentage (%)=(film thickness of liquid-repellent regions−film thickness of lyophilic regions)×100/film thickness of liquid-repellent regions

[Studying of Removability of Periphery of Concave Pattern (Application of Radiation)]

An entire surface of a film obtained in the same manner as in [Contact angle] was irradiated with an ultraviolet ray at an exposure quantity of 150 mJ/cm², and heated with a hot plate at 110° C. for 5 minutes. Through the above heating, a lyophilic/liquid-repellent patterned film as shown in the third figure of FIG. 2 was obtained. Numbers assigned in FIG. 2 correspond to those assigned in FIG. 1. Thereafter, as shown in FIG. 2, film thicknesses after the above heating at the exposed regions 31 and the unexposed regions 41 previously-marked on the substrate, the film thicknesses of which had been measured in [Studying of concave patternability], were measured to determine a film thickness of regions 43, which had been the unexposed regions of the film obtained in [Studying of concave patternability], and a film thickness of regions 33, which had been the exposed regions of the film obtained in [Studying of concave patternability]. Then, a difference between the film thickness of regions 43 and the film thickness of regions 33 was calculated. This was followed by measuring a contact angle of tetradecane on a film surface 44 of the regions which had been the unexposed regions of the film obtained in [Studying of concave patternability], in the same manner as in [Contact angle]. In Table 2, for the sake of convenience, the regions which had been the unexposed regions and the regions which had been the exposed regions of the film obtained in [Studying of concave patternability] are referred to as the liquid-repellent regions and the lyophilic regions, respectively.

[Studying of Removability of Periphery of Concave Pattern (Heating)]

A film obtained in the same manner as in [Contact angle] was heated in a clean oven at 200° C. for 30 minutes. Thereafter, in the same manner as in [Studying of removability of periphery of concave pattern (application of radiation)], a difference between a film thickness of the regions which had been the liquid-repellent regions and a film thickness of the regions which had been the lyophilic regions, of the film obtained in [Studying of concave patternability], was calculated. Also, a contact angle of tetradecane was measured on the film surface of the regions which had been the liquid-repellent regions of the film obtained in [Studying of concave patternability].

[Ink Application-Assisting Performance on Lyophilic/Liquid-Repellent Pattern]

Figure 3A:
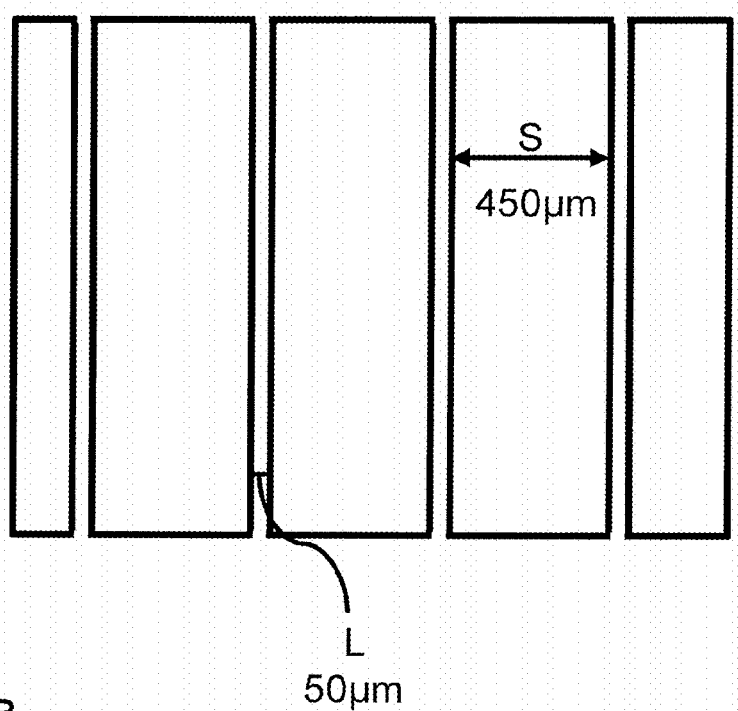
FIG. 3A is a plan schematic view of a quartz mask used for e.g. ink application-assisting performance test performed on a lyophilic/liquid-repellent pattern in Examples.
Figure 3B:
FIG. 3B is a schematic cross-sectional view of the quartz mask.
Figure 4A:
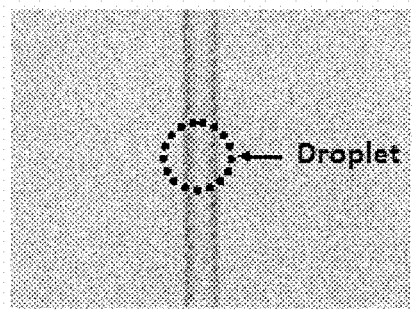
FIG. 4A is a microscopic observation photograph showing a lyophilic/liquid-repellent pattern not disturbed by droplet in e.g., ink application-assisting performance test performed on a lyophilic/liquid-repellent pattern in Examples.
Figure 4B:
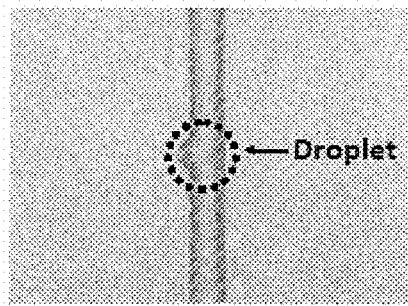
FIG. 4B is a microscopic observation photograph showing a lyophilic/liquid-repellent pattern disturbed by droplet in e.g., the above test.

In the same manner as in [Contact angle] except that the quartz mask was a quartz mask (L/S=50 μm/450 μm) as shown in FIGS. 3A and 3B, a lyophilic/liquid-repellent patterned film was formed. At the vicinity of the resultant concave regions, 60 pl of tetradecane was dropwise added with an automatic micro-contact angle gauge (MCA-2, manufactured by Kyowa Interface Science Co., Ltd.) by using a microcapillary. Five seconds thereafter, the part receiving the dropwise adding was microscopically observed from the direction in which the dropwise adding was done (from top). The successful patterning of tetradecane along the lyophilic/liquid-repellent pattern was graded as ○, namely the concave line formed (line seen in FIG. 4A) not being disturbed by the droplet of tetradecane as shown FIG. 4A was graded as ○, whereas the patterning where tetradecane was present even at part of regions other than the concave regions of the lyophilic/liquid-repellent pattern was graded as Δ, namely even part of the concave line formed (line seen in FIG. 4B) being disturbed by the droplet of tetradecane as shown FIG. 4B was graded as Δ.

The observation done after the passage of five seconds from the dropwise adding of tetradecane was because of the concern that patterning of droplet unsuccessful in a short period of time of about 5 seconds could cause the droplet to remain at a position differing from a desired position due to the drying of the droplet and this could not provide wiring with a desired shape.

[Evaluation of Exposure Sensitivity in Lyophilic/Liquid-Repellent Patterned Film Formation]

In the same manner as in [Contact angle] except that the quartz mask was a quartz mask (L/S=50 μm/450 μm), and that the exposure quantity was varied to be 50, 100, 150, 200, 250 or 300 mJ/cm², a lyophilic/liquid-repellent patterned film was formed. Its film thickness reduction percentage was calculated in the same manner as in [Studying of concave patternability]. The film thickness reduction percentage goes up with the increase of the exposure quantity. An exposure quantity when the film thickness reduction percentage was 10% or more was defined as representing sensitivity.

[Evaluation of Resolution in Lyophilic/Liquid-Repellent Patterned Film Formation]

In the same manner as in [Contact angle] except that the quartz mask was a quartz mask (L/S=10 μm/90 μm), a lyophilic/liquid-repellent patterned film was formed. At the vicinity of the concave regions, a trace amount (<10 pl) of tetradecane was dropwise added with an automatic microcontact angle gauge (MCA-2, manufactured by Kyowa Interface Science Co., Ltd.) by using a microcapillary. The regions receiving the dropwise adding were microscopically observed from the dropping direction (from top). The successful patterning of tetradecane along the lyophilic/liquid-repellent pattern was graded as good resolution (○). The patterning where, for example, tetradecane was present at regions other than the concave regions of the lyophilic/liquid-repellent pattern, resulting in the concave line of the lyophilic/liquid-repellent pattern being disturbed, was graded as somewhat good resolution (Δ).

[Wiring Formation Method by Application of Radiation and by Heating]
[Evaluation of Wiring Formability: Line Formability and Patternability]

In the same manner as in [Contact angle] except that the quartz mask was a quartz mask (L/S=10 μm/90 μm), a lyophilic/liquid-repellent patterned film was formed, and a concave pattern line with a width of 10 μm was formed. On a substrate having the concave pattern line formed, silver nanoink (NPS-JL, manufactured by Harima Chemicals Group, Inc.) was applied by spin coating method to pattern the silver nanoink on the 10 μm-wide concave pattern line, and thereafter calcined at 120° C. for 30 minutes, so that a silver wiring was formed. Thereafter, an entire surface of the resultant substrate having wiring was irradiated with 150 mJ/cm² of an ultraviolet ray as a second exposure, and heated on a hot plate at 110° C. for 5 minutes, so that the convex regions (liquid-repellent regions) at the periphery of the silver wiring were removed, and a convex silver wiring was formed. If at this time the resultant silver wiring was microscopically observed to have a line pattern shape, the line formability of the wiring was graded as good (○). If the microscopic observation found the width of the silver wiring formed to be within 10±5 μm, the patternability was graded as good (○), and if the microscopic observation found the width of the silver wiring formed to be more than 15 μm, the patternability was graded as somewhat good (Δ).

[Evaluation of Wiring Formation: Adhesion]

In the same manner as in "Evaluation of wiring formation: line formability and patternability", silver wiring was formed. The resultant silver wiring was subjected to tape peeling test. In the tape peeling test (in accordance with JIS Z 1522), the wiring retained without any peeling was graded as good adhesion (○), and even a part of the silver wiring adhering to the tape resulting in the peeling was graded as somewhat good adhesion (Δ).

Comparative Examples 1 to 15

In the same manner as in [Contact angle] except that the quartz mask was a quartz mask (L/S=10 μm/90 μm), a lyophilic/liquid-repellent patterned film was formed, and a concave pattern line with a width of 10 μm was formed. On a substrate having the concave pattern line formed, silver nanoink (NPS-JL, manufactured by Harima Chemicals Group, Inc.) was applied by spin coating method to pattern the silver nanoink on the 10 μm-wide concave pattern line, and thereafter calcined at 120° C. for 30 minutes, so that a silver substrate having wiring was formed. Thereafter, the resultant silver substrate having wiring was immersed in a resist peeling liquid JSR THB-S1 (manufactured by JSR Corporation) for 30 minutes, and washed with water. The microscopic observation at this time found that the convex regions had been removed, but at the same time the wiring, too, had been removed.

Tests using the compositions 1 to 15 were respectively named Comparative Examples 1 to 15.

TABLE 2

| | Concave patternability | | Contact angle (°) | | | | | |
|---|---|---|---|---|---|---|---|---|
| | (Liquid-repellent regions)-(Lyophilic regions) (μm) | Film thickness reduction percentage (%) | Lyophilic regions water | Liquid-repellent regions water | Lyophilic regions decane | Liquid-repellent regions decane | Lyophilic regions tetradecane | Liquid-repellent regions tetradecane |
| Example 1 | 0.13 | 26 | 73 | 108 | 5 | 54 | 5 | 64 |
| Example 2 | 0.25 | 50 | 61 | 121 | 5 | 60 | 5 | 69 |

TABLE 2-continued

| | | | | | | | | |
|---|---|---|---|---|---|---|---|---|
| Example 3 | 0.18 | 36 | 74 | 107 | 6 | 55 | 6 | 63 |
| Example 4 | 0.09 | 18 | 70 | 102 | 5 | 49 | 6 | 58 |
| Example 5 | 0.10 | 20 | 58 | 105 | 6 | 51 | 5 | 60 |
| Example 6 | 0.06 | 12 | 55 | 98 | 6 | 49 | 7 | 57 |
| Example 7 | 0.30 | 60 | 62 | 120 | 5 | 62 | 6 | 70 |
| Example 8 | 0.20 | 40 | 71 | 105 | 5 | 52 | 5 | 61 |
| Example 9 | 0.26 | 52 | 48 | 110 | 5 | 58 | 5 | 67 |
| Example 10 | 0.24 | 48 | 45 | 105 | 5 | 51 | 6 | 62 |
| Example 11 | 0.12 | 24 | 73 | 109 | 5 | 53 | 6 | 65 |
| Example 12 | 0.11 | 22 | 69 | 101 | 6 | 51 | 6 | 60 |
| Example 13 | 0.15 | 30 | 55 | 104 | 6 | 49 | 5 | 62 |
| Example 14 | 0.14 | 28 | 75 | 110 | 5 | 57 | 6 | 66 |
| Example 15 | 0.05 | 10 | 30 | 38 | 6 | 7 | 7 | 7 |

| | Removability of periphery of concave pattern (application of radiation) | | Removability of periphery of concave pattern (heating) | | | | | Wiring formation method (by application of radiation and by heating) | | |
|---|---|---|---|---|---|---|---|---|---|---|
| | After 150 mJ/cm² irradiation (Liquid-repellent regions)-(Lyophilic regions) (μm) | After 150 mJ/cm² irradiation Liquid-repellent regions tetradecane | After heating at 200° C. (Liquid-repellent regions)-(Lyophilic regions) (μm) | After heating at 200° C. Liquid-repellent regions tetradecane | Ink application-assisting performance | Exposure sensitivity (mJ/cm²) | Resolution (μm) | Line formability | Patternability | Adhesion |
| Example 1 | 0.00 | 5 | 0.01 | 6 | ○ | 50 | ○ | ○ | ○ | ○ |
| Example 2 | 0.01 | 6 | 0.01 | 6 | ○ | 50 | ○ | ○ | ○ | ○ |
| Example 3 | 0.00 | 5 | 0.02 | 5 | ○ | 100 | ○ | ○ | ○ | ○ |
| Example 4 | 0.00 | 5 | 0.01 | 7 | ○ | 50 | ○ | ○ | ○ | ○ |
| Example 5 | 0.00 | 5 | 0.01 | 6 | ○ | 100 | ○ | ○ | ○ | ○ |
| Example 6 | 0.00 | 6 | 0.01 | 5 | ○ | 100 | ○ | ○ | ○ | ○ |
| Example 7 | 0.02 | 5 | 0.02 | 5 | ○ | 50 | ○ | ○ | ○ | ○ |
| Example 8 | 0.01 | 5 | 0.02 | 6 | ○ | 100 | ○ | ○ | ○ | ○ |
| Example 9 | 0.00 | 5 | 0.01 | 5 | ○ | 50 | ○ | ○ | ○ | ○ |
| Example 10 | 0.00 | 5 | 0.01 | 6 | ○ | 50 | ○ | ○ | ○ | ○ |
| Example 11 | 0.01 | 6 | 0.00 | 7 | ○ | 50 | ○ | ○ | ○ | ○ |
| Example 12 | 0.00 | 5 | 0.01 | 6 | ○ | 50 | ○ | ○ | ○ | ○ |
| Example 13 | 0.01 | 6 | 0.01 | 6 | ○ | 100 | ○ | ○ | ○ | ○ |
| Example 14 | 0.01 | 5 | 0.01 | 5 | ○ | 50 | ○ | ○ | ○ | ○ |
| Example 15 | 0.01 | 6 | 0.01 | 6 | Δ | 50 | Δ | ○ | Δ | Δ |

According to the results shown in Table 2, the embodiments of the present invention were found to be able to form wiring that was highly definite and excellent in adhesion onto a substrate.

It was also found that the removal of the convex regions involving the use of a conventionally known resist peeling liquid was accompanied by the removal of the wiring, which was all the more so when the wiring was of a higher definition, resulting in the failure to obtain a substrate with a desired wiring.

INDUSTRIAL APPLICABILITY

The embodiments of the present invention can easily form wiring that is fine and elaborate. The resultant wiring such as conductive pattern is excellent in conductivity and in adhesion onto a substrate. Thus, the production process in the embodiments of the present invention can be suited for use in the formation of electronic circuits. By the use of the wiring obtained by the production process in the embodiments of the present invention, it is possible to obtain electronic devices that are downsized and thin with higher performance, including liquid crystal displays, mobile information devices such as mobile phones, digital cameras, organic displays, organic EL lights, various sensors and wearable devices.

Obviously, numerous modifications and variations of the present invention are possible in light of the above teachings. It is therefore to be understood that within the scope of the appended claims, the invention may be practiced otherwise than as specifically described herein.

The invention claimed is:

1. A production process for producing a substrate having wiring, the production process comprising:
 applying a radiation-sensitive composition on a substrate to form a coating film,
 irradiating a prescribed part of the coating film with radiation to allow the coating film to have a radiation-irradiated region and a radiation-unirradiated region,
 allowing the coating film to have a concave region and a convex region by heating the coating film without employing a development,
 forming wiring on the concave region, and
 removing the convex region by an application of radiation or by heating.

2. The production process according to claim 1, wherein the radiation-sensitive composition comprises: a compound having an acid-dissociable group; and an acid generator.

3. The production process according to claim 2, wherein the acid-dissociable group comprises a fluorine atom.

4. The production process according to claim 2, wherein the acid-dissociable group comprises at least one bond selected from the group consisting of an acetal bond and a hemiacetal ester bond.

5. The production process according to claim 4, wherein the acid-dissociable group comprises at least one group selected from the group consisting of a group represented by Formula (1-1) and a group represented by Formula (1-2):

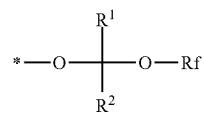
(1-1)

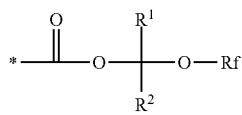
(1-2)

wherein in Formulae (1-1) and (1-2), $R^1$ and $R^2$ are each independently a hydrogen atom or a methyl group; each Rf is independently an organic group having a fluorine atom; and * is a bonding site.

6. The production process according to claim 2, wherein the compound having an acid-dissociable group comprises at least one unit selected from the group consisting of structural units represented by Formulae (2) to (6):

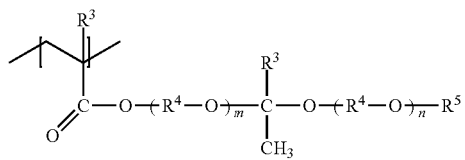
(2)

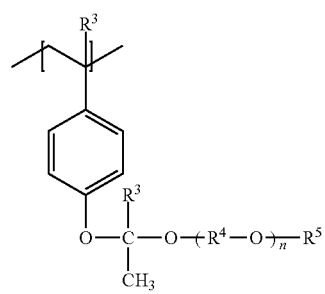
(3)

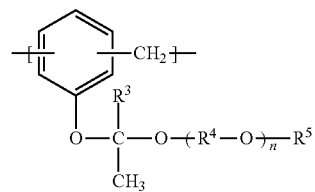
(4)

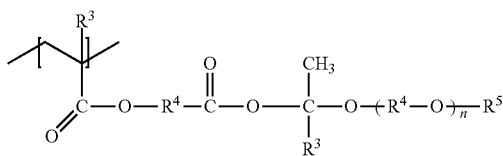
(5)

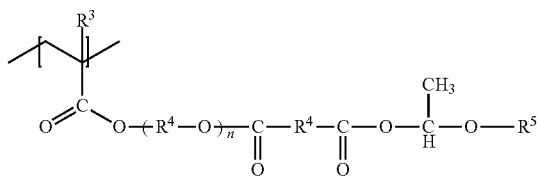
(6)

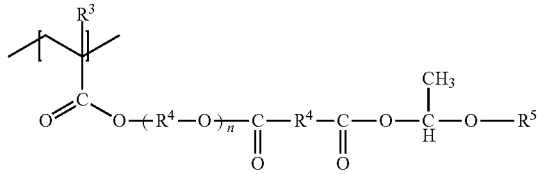

wherein in Formulae (2) to (6), each $R^3$ is independently a hydrogen atom or a methyl group; each $R^4$ is independently a methylene group, a C2-12 alkylene group, a C2-12 alkenylene group, a C6-13 substituted or unsubstituted aromatic hydrocarbon group, a C4-12 substituted or unsubstituted alicyclic hydrocarbon group, or a group in which at least one hydrogen atom of these groups is substituted with a fluorine atom; each $R^5$ is independently a group in which at least one hydrogen atom of a hydrocarbon group is substituted with a fluorine atom; m is 0 or 1; and each n is independently an integer of from 0 to 12.

7. The production process according to claim 1, wherein the forming of wiring comprises: applying a wiring-forming material on the concave region; and thereafter heating the wiring-forming material and/or irradiating the wiring-forming material with radiation.

8. The production process according to claim 1, wherein a difference between a surface of the concave region and a surface of the convex region in contact angle with respect to tetradecane is 30° or more.

9. The production process according to claim 1, wherein the concave region has a film thickness that is reduced by 10% or more as compared with a film thickness of the convex region.

10. The production process according to claim 1, wherein the radiation-sensitive composition comprises a polymerizable compound having an ethylenic unsaturated bond.

* * * * *